(12) United States Patent
Esterline et al.

(10) Patent No.: US 10,566,928 B2
(45) Date of Patent: Feb. 18, 2020

(54) SYSTEM AND METHOD FOR MULTIFUNCTION SEGMENTED ARRAY COMPENSATION FOR OSCILLATORS

(71) Applicants: John Esterline, Marysville, PA (US); Alan Snavely, Hummelstown, PA (US); Terry Hitt, Shiremanstown, PA (US)

(72) Inventors: John Esterline, Marysville, PA (US); Alan Snavely, Hummelstown, PA (US); Terry Hitt, Shiremanstown, PA (US)

(73) Assignee: Esterline Research and Design LLC, Shiremanstown, PA (US)

( * ) Notice: Subject to any disclaimer, the term of this patent is extended or adjusted under 35 U.S.C. 154(b) by 0 days.

(21) Appl. No.: 16/053,694

(22) Filed: Aug. 2, 2018

(65) Prior Publication Data

US 2018/0342980 A1    Nov. 29, 2018

Related U.S. Application Data

(63) Continuation of application No. 15/148,398, filed on May 6, 2016, now Pat. No. 10,075,130.

(51) Int. Cl.
| | | |
|---|---|---|
| *H03B 5/04* | (2006.01) | |
| *G06N 7/00* | (2006.01) | |
| *G06N 3/04* | (2006.01) | |
| *G06N 3/02* | (2006.01) | |
| *G01R 23/00* | (2006.01) | |
| *G01R 23/15* | (2006.01) | |
| *H03B 5/32* | (2006.01) | |
| *H03B 5/12* | (2006.01) | |

(Continued)

(52) U.S. Cl.
CPC .............. *H03B 5/04* (2013.01); *G01R 23/00* (2013.01); *G01R 23/15* (2013.01); *G06N 3/02* (2013.01); *G06N 3/04* (2013.01); *G06N 7/00* (2013.01); *G06N 7/08* (2013.01); *H03B 5/1206* (2013.01); *H03B 5/1228* (2013.01); *H03B 5/32* (2013.01); *H03L 1/00* (2013.01); *H03L 7/099* (2013.01)

(58) Field of Classification Search
CPC ........... H03L 1/00; H03L 7/099; G01R 23/15; G01R 23/16; G01R 23/00; H03B 5/04; H03B 5/32; H03B 5/1228; H03B 7/09; H03B 5/1206; G06N 3/02; G06N 3/04; G06N 7/00
USPC .......................................... 331/158, 175, 176
See application file for complete search history.

(56) References Cited

U.S. PATENT DOCUMENTS 4,891,611 A * 1/1990 Frerking ................... H03L 1/00
                                                                          331/10
5,336,937 A    8/1994 Sridhar et al.
(Continued)

*Primary Examiner* — Arnold M Kinkead
(74) *Attorney, Agent, or Firm* — Tucker Arensberg, P.C.

(57) ABSTRACT

The present disclosure provides for a system and method for compensating an electronic oscillator for one or more environmental parameters. A method may comprise segmenting test data received from an output signal of the oscillator and generating at least one correction voltage to thereby compensate the oscillator for one or more environmental parameters. A system may comprise at least one multi-function segmented array compensation module configured to receive one or more output signals from an oscillator and generate one or more correction voltages to thereby compensate the oscillator for environmental parameters. The system may also comprise one or more sensors and a user EFC.

14 Claims, 26 Drawing Sheets

(51) Int. Cl.
*H03L 7/099* (2006.01)
*G06N 7/08* (2006.01)
*H03L 1/00* (2006.01)

(56) References Cited

U.S. PATENT DOCUMENTS

| | | |
|---|---|---|
| 5,714,866 A | 2/1998 | S et al. |
| 8,674,778 B2 | 3/2014 | Nicholls et al. |
| 9,092,726 B2 | 7/2015 | Esterline |
| 9,092,729 B2 | 7/2015 | Esterline |
| 9,092,730 B2 | 7/2015 | Esterline et al. |
| 2009/0113049 A1 | 4/2009 | Nasle |
| 2014/0218119 A1* | 8/2014 | He .................. G01S 19/235 331/17 |
| 2015/0112907 A1 | 4/2015 | Nasle et al. |

\* cited by examiner

SYSTEM AND METHOD FOR MULTIFUNCTION SEGMENTED ARRAY COMPENSATION FOR OSCILLATORS

CROSS-REFERENCE TO RELATED APPLICATIONS

This Application is a continuation of pending U.S. patent application Ser. No. 15/148,398, filed on May 6, 2016, entitled "System and Method for Multifunction Segmented Array Compensation for Oscillators," which itself claims priority under 35 U.S.C. 119(e) to U.S. Provisional Patent Application No. 62/332,765, filed on May 6, 2016, entitled "Temperature and Trim Effect Compensation of a VCXO Using a Multidimensional Segmented Polynomial Array," which are both hereby incorporated by reference in its entirety.

BACKGROUND

The present disclosure provides for a system and method for multifunction segmented array compensation ("M-SAC") that can be applied to compensate electronic oscillators for one or more environmental parameters. As discussed herein the M-SAC system and method provide for a novel solution that overcomes the limitations of the prior art.

While the use of an artificial neural network ("ANN") provides for a good curve fit and is widely known, this approach has several significant weaknesses including a slow solution speed and unreliable results. For example, the ANN methodology requires several minutes for frequency versus temperature performance and tens of minutes to an half hour or more for trim effect compensation. The results obtained using the ANN methodology are also unpredictable, requiring a user to repeat the solutions several times before obtaining a workable result. The need to repeat solutions leads to even longer solution times, on the order of tens of minutes for frequency versus temperature and over an hour for trim effect compensation. The slow and unreliable nature of the ANN methodology significantly limits throughput and manufacturability.

Other limitations of the prior art include the lack of enabling a user-defined performance level. For example, thermistor resistor networks provide for fitting a solution based on discrete values for portions of test data and then finding the best solution for those portions. For example, if a user desired a performance of 250 ppb, but the solution resulted in 750 ppb, the user has no mechanism for correcting the performance. Polynomial generators fit the curve with a single polynomial for a fixed order, typically $3^{rd}$ or $5^{th}$ order polynomials. A user is limited to using only the best fit for these polynomials. Microcontroller Compensated Crystal Oscillators ("MCXO") use algorithms at a fixed interval of points and linear interpolation. Drawing straight lines between points means that data can never be fit better than a straight line segment. Using ANN, a user is restricted to the training of the ANN and the number of neurons given to the solution. Adding more and more neurons to a solution in an attempt to achieve the desired performance level results in a more complicated network, makes the solution harder to solve, and increases the likelihood that the algorithm will be stuck in local minima.

As can be seen from this review of the prior art, there exists a need for a commercially viable solution to compensate oscillators for environmental parameters that is fast, reliable, and efficient. It would also be advantageous if such as system and method enabled a user to define and customize the necessary performance of the solution for a given application.

SUMMARY OF THE INVENTION

The present disclosure provides for a system and method for compensating oscillators for environmental parameters that overcome the limitations of the prior art. A method may comprise receiving a test data set representative of the frequency output of the oscillator at a plurality of data points in at least two dimensions, wherein each data point corresponds to at least one environmental parameter. The method may further comprise receiving at least one set of user criteria for the test data set and segmenting the test data set into a plurality of segments. The length of each segment may be determined by the user criteria. An optimal segment value may be generated for each segment in the test data set by applying at least one function to each of the segments. These optimal segment values may be stored in at least one electronic memory device. The method then determines whether or not the stored optimal segment values correspond to the entire test data set. If so, then the optimal segment values are all stored as an array that can be easily accessed by a user. If the optimal segment values do not correspond to the entire test data set, then the method may be repeated until optimal segment values are stored for the entire test data set.

The present disclosure also provides for a non-transitory storage medium containing machine-readable program code, which, when executed by a processor, causes the processor to perform the following: receive a test data set representative of the frequency output of an oscillator at a plurality of data points in at least two dimensions, wherein each data point corresponds to at least one environmental parameter; receive at least one set of user criteria for the test data set; segment the test data set into a plurality of segments, wherein the length of each segment is determined by applying user criteria; generate an optimal segment value for each segment in the test data set by applying at least one function to each of the segments; store each optimal segment value on at least one electronic memory device; and determine whether or not the stored optimal segment value corresponds to the entire test data set, and if the stored optimal segment values do correspond to the entire test data set, storing the optimal segment values as an array, and if the stored optimal segment values to not correspond to the entire test data set, repeating the method until optimal segment values are stored for the entire test data set.

A system of the present disclosure may comprise at least one multi-function segmented array compensation module comprising at least one processor configured to receive at least one output signal from the electronic oscillator wherein each output signal corresponds to an environmental parameter and wherein each multi-function segmented array compensation module is further configured to assess each output signal and generate at least one correction voltage to thereby compensate the oscillator for the associated environmental parameter.

To maximize storage density for a given function and performance level, the system and method described herein enable a user to define certain performance criteria for the solution, such as a maximum residual error. This approach enables a user to define what level of fit is needed for the specific application and then use the method to find an appropriate solution to meet those needs. The application of user-defined performance criteria is a significant improvement over the prior art which fails to provide for this level of customization and specificity.

The segmented approach to fitting the test data is also a substantial improvement over the prior art. The quality of the fit determines the length of each segment, thereby enabling a better overall solution. Methods disclosed by the prior art fail to provide for segmenting the test data based on performance criteria. Further, the system and method disclosed herein provide for applying a plurality of different functions to each segment to determine which function provides for the best solution. For example storage density can be used as a measure of the quality of a particular function's solution. The storage densities for various solutions can be compared, and the function providing the best result can be stored for use in compensation by the user.

In particular, the M-SAC fitting method of the present disclosure provides for a significant improvement over the prior art based on four key performance metrics: deterministic solutions, precision of fit, storage density, and curve fit process time.

1. Deterministic Solutions

A key feature of the M-SAC fitting method is the ability to curve fit the data set to a user-specified level of error. This feature is made possible through the segmenting methodology, which is accomplished by starting at the beginning of the data set and applying all orders (1 to 5) of the polynomial functions contained in the function bank to the data set and curve fitting the data so that the largest contiguous set of data points achieving the specified residual error tolerance with the fewest number of storage elements is determined. The process is then repeated from the last data point in the previous segment until the entire data set is fit. The number of data points able to be fit in a single segment is determined by the specified error tolerance. For example, a sufficiently large error tolerance might allow a fit of the entire data set within a single segment. Conversely, fits approaching the noise level of the data are also achievable with the only consequence being a large number of segments and thus a large number of storage elements. This degree of flexibility does not exist with any other prior art fitting method used for the temperature compensation of electronic oscillators.

2. Precision of Fit

Low residual error is the primary performance requirement of any curve fitting method. When applied to temperature compensation, the precision of the compensation is ultimately limited by the precision of the fit to the original data. As previously stated, the segmenting methodology achieves fits approaching the noise level of the data and thus surpasses most other published methods utilized for temperature compensation of electronic oscillators. Comparative information and supportive documentation is provided later in this document to illustrate the superior performance of the M-SAC fitting method.

3. Storage Density

This is the number of mathematical elements contained in the final curve fit solution. With respect to curve fitting methods utilized during the temperature compensation of electronic oscillators, the examples set forth herein has shown that the M-SAC method can achieve the lowest residual error performance with the fewest number of mathematical storage elements. This level of performance is made possible through the use of function optimization, where all functions contained in a function bank are evaluated to determine which functions fit the greatest number of data points with the fewest number of storage elements. When applied to temperature compensation, fewer non-volatile storage elements translate to an opportunity for reduction in both size as well as circuit complexity. This is an enormous benefit with the ever increasing desire for miniaturization.

4. Curve Fit Process Time

This is the amount of time required to calculate a curve fit solution. Frequency versus temperature data can be curve fit to state of the art levels with greater speed using the M-SAC method than with any other curve fitting method currently used for temperature compensation of electronic oscillators, except for linear interpolation. The speed improvement is most striking when compared to the ANN, where polynomial regression techniques cannot be used in the solution. The ANN method requires a "training" and "learning" process that begins with a set of randomized initial values and often requires thousands to tens of thousands of iterations to learn the solution space. Additionally, the greater the number of neurons needed, the more the interaction between them (because the functions are continuous and exist over the entire solution space). This not only increases the time needed to obtain a solution, but also increases the number of local minima solutions where a compliant error tolerance may not necessarily be achieved. Thus, a solution not achieving the desired error tolerance will necessitate the repetition of the entire process, possibly with the addition of more neurons. As a result, it is not uncommon for the "training" and "learning" process to take several minutes to provide a solution with an acceptable error. It is easy to see the potential throughput bottleneck in the implementation of the ANN process in a high volume environment where a very low error tolerance is needed. The M-SAC method does not suffer from this problem. The deterministic nature of the solution, and functions that do not interact, enable the M-SAC to easily adapt to a high production environment and provide a solution that exceeds the ANN capability in both time and precision.

BRIEF DESCRIPTION OF THE DRAWINGS

The accompanying drawings, which are included to provide further understanding of the disclosure and are incorporated in and constitute a part of this specification illustrate embodiments of the disclosure, and together with the description, serve to explain the principles of the disclosure.

In the drawings.

DETAILED DESCRIPTION

Reference will now be made in detail to the embodiments of the present disclosure, examples of which are illustrated in the accompanying drawings. Wherever possible, the same reference numbers will be used throughout the specification to refer to the same or like parts.

The present disclosure provides for a system and method for compensating electronic oscillators for one or more environmental parameters. It is contemplated that the system and method disclosed herein may be applied to a variety of different environmental parameters including but not limited to temperature, pressure, ageing, off-time, on-time, thermal history (also referred to as thermal hysteresis), air flow, trim effect, acceleration sensitivity, vibration, and orientation effects (i.e., x, y, z position in space). While some of the examples set forth herein may focus on temperature compensation, trim effect, and linearity compensation, this is in no way intended to limit the scope of the invention.

Figure 1:
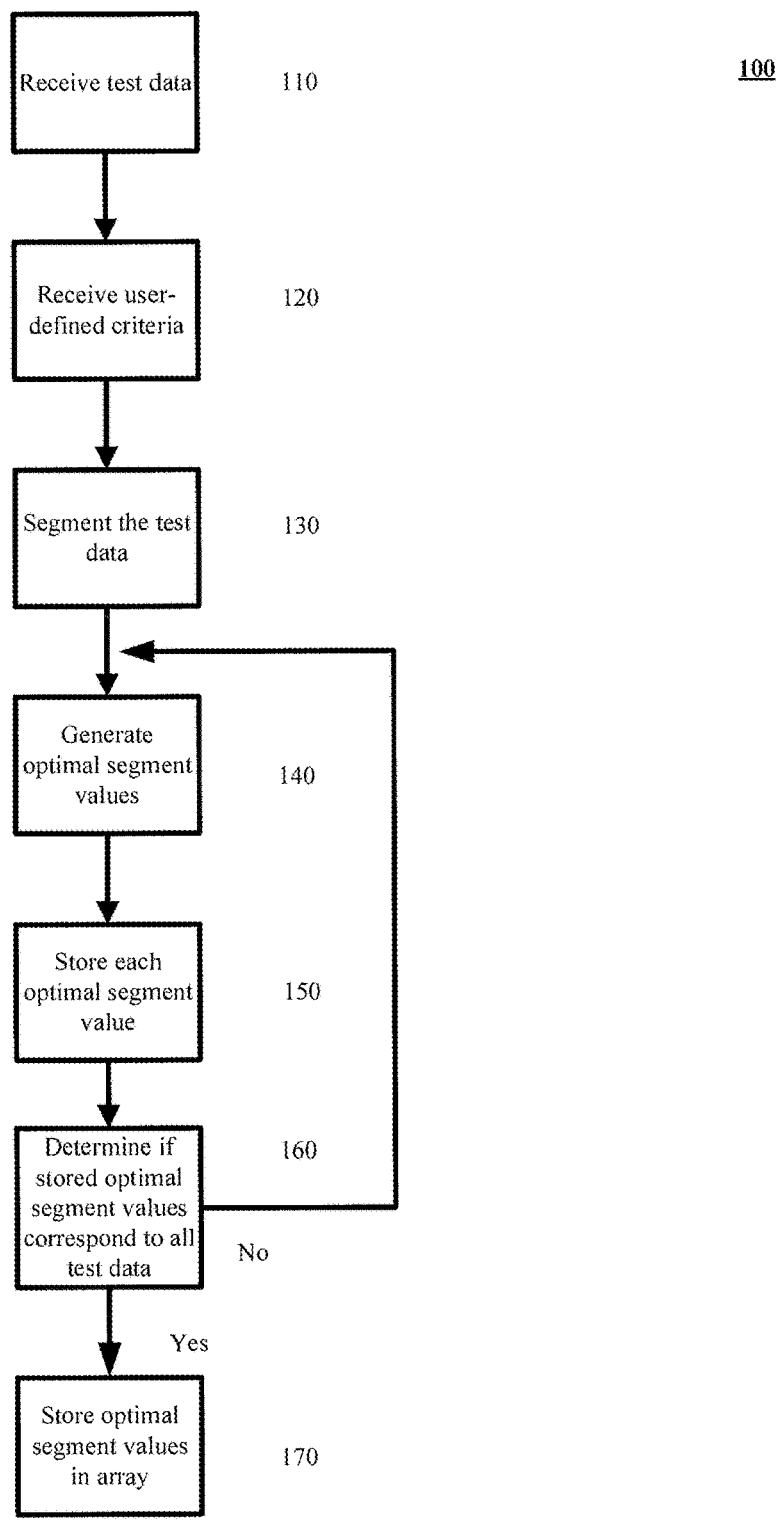
FIG. 1 is representative of a method for compensating at least one electronic oscillator of the present disclosure.

One embodiment of a method of the present disclosure is represented by FIG. 1. The method 100 may comprise receiving a test data set in step 110 wherein the test data set is representative of the frequency output of the electronic oscillator at a plurality of data points in at least two dimensions (x, y). The data set may be of a length n. For example, when assessing an electronic oscillator's frequency as compared to a control voltage, the control x represents the control voltage and y represents the frequency deviation. In crystal oscillators, this assessment inherently possesses non-linearity due to the fact that the frequency is changing by changing the voltage on a varactor. This varactor's capacitance versus voltage curve is nonlinear and that translates into a nonlinear frequency response to the control voltage. In one embodiment, the desired response is a positive slope linear frequency response. This response may be generated by determining the ideal frequency versus control voltage curve which then is fit by sweeping the control voltage over the operating range. The control voltage is read at various discrete points and then the DAC is swept until the target output frequency is achieved. This DAC value is stored and the method may then fit the DAC value to create a response that is much more linear than inherently obtained.

When assessing an oscillator's frequency output for temperature compensation, x represents the temperature and y represents the frequency deviation. For improved performance, instead of using the frequency deviation, the method may fit the actual DAC value obtained to put the oscillator "on frequency" at a given temperature. This approach holds potential for reducing errors that may occur from assuming a constant tuning sensitivity (which may change with temperature and magnitude).

Referring again to FIG. 1, the method may further comprise receiving at least one set of user-defined criteria for the test data set in step 120. This user-defined criteria may correspond to the particular function the user would like the method to use in fitting the test data set and/or an error limit that defines when a new segment is needed. This error limit may be referred to herein as a maximum residual error. Enabling the user to determine the quality of the fit is a significant improvement over the prior art. Not only does the application of a maximum residual error enable the user to define the length of each segment as a function of quality of fit, but it also provides for a maximal storage density for a particular function and performance level.

The method provides for starting at the beginning of the test data curve and proceeding along the curve until the error threshold is exceeded. For example, if the user specified a maximum residual error of 5 ppb, the method would start with the first three points and fit those with a particular function. If the result was a residual error less than 5 ppb, the algorithm would fit the first four points, and so on. This novel approach enables the individual solution to dictate how many points a segment could fit and still achieve the required quality and provides for an improvement over the prior art which merely takes the results of curve fitting as they are.

Applying the user-defined criteria, the method 100 segments the test data into a plurality of segments by applying at least one function to the test data in step 130. In creating these segments, the method 100 provides for defining and seeding all coefficients, which depends on the function chosen.

In step 140, the method 100 provides for generating an optimal segment value for each segment in the test data set by applying at least one function to each of the segments. At least one algorithmic technique may be applied to the segment to determine whether or not the residual error of the fit is less than the maximum residual error as defined by the user. If the residual error of the fit is more than the maximum residual error, then the method 100 provides for cutting the number of data points in half until a successful outcome is reached. For example, if the method 100 was attempting to fit data points 50 to 100, then the method 100 would attempt to fit data points 50 to 75. Once the method 100 finds a solution that meets the maximum residual error, then the method 100 will work back up to the other data points. For example, if the method 100 finds that the solution fits data points 50 to 75 but did not fit data points 50 to 100, the method 100 must determine where in the test data set between data points 75 to 100 the solution no longer meets the maximum residual error. The method 100 would then split the data points from 75 to 100 in half and solve data points 50 to 88 to determine whether or not the solution meets the user-defined maximum residual error. The method 100 continues to solve the test data set in this manner to thereby determine the maximum number of points that can be fit using the specified function with less than the maximum residual error.

In step 150, all of the optimal segment values needed to implement the function are stored in at least one electronic memory device such as a server (during manufacturing of the oscillator) or in the firmware of the oscillator itself in a commercial product. The optimal segment values may include all coefficients for the function, a start value, a stop value, and any scaling values that may be needed to facilitate use in the digital hardware implementation of the method 100. In Step 160, the method 100 determines whether or not the entire data set has been fit using the particular function or if there are one or more segments that remain to be fit. If the entire data set has been fit using the particular function, then all of the segments can be stored in an array for easy digital access by a user in step 170, either during manufacturing of the oscillator via a server or when using the oscillator as a finished commercial product via the oscillator's firmware. In one embodiment, the array may store information corresponding to the function type, the number of segments, one or more coefficients for each segment, as well as scaling values as needed. Other types of information gathered by the method 100 may also be saved. If there are one or more segments remaining to be fit, then the method 100 will repeat steps 130-170 until all segments of the test data set have been fit. The saved array holds potential for providing a precise fit of the entire test data set in either simulation or through a hardware implementation.

Figure 2:
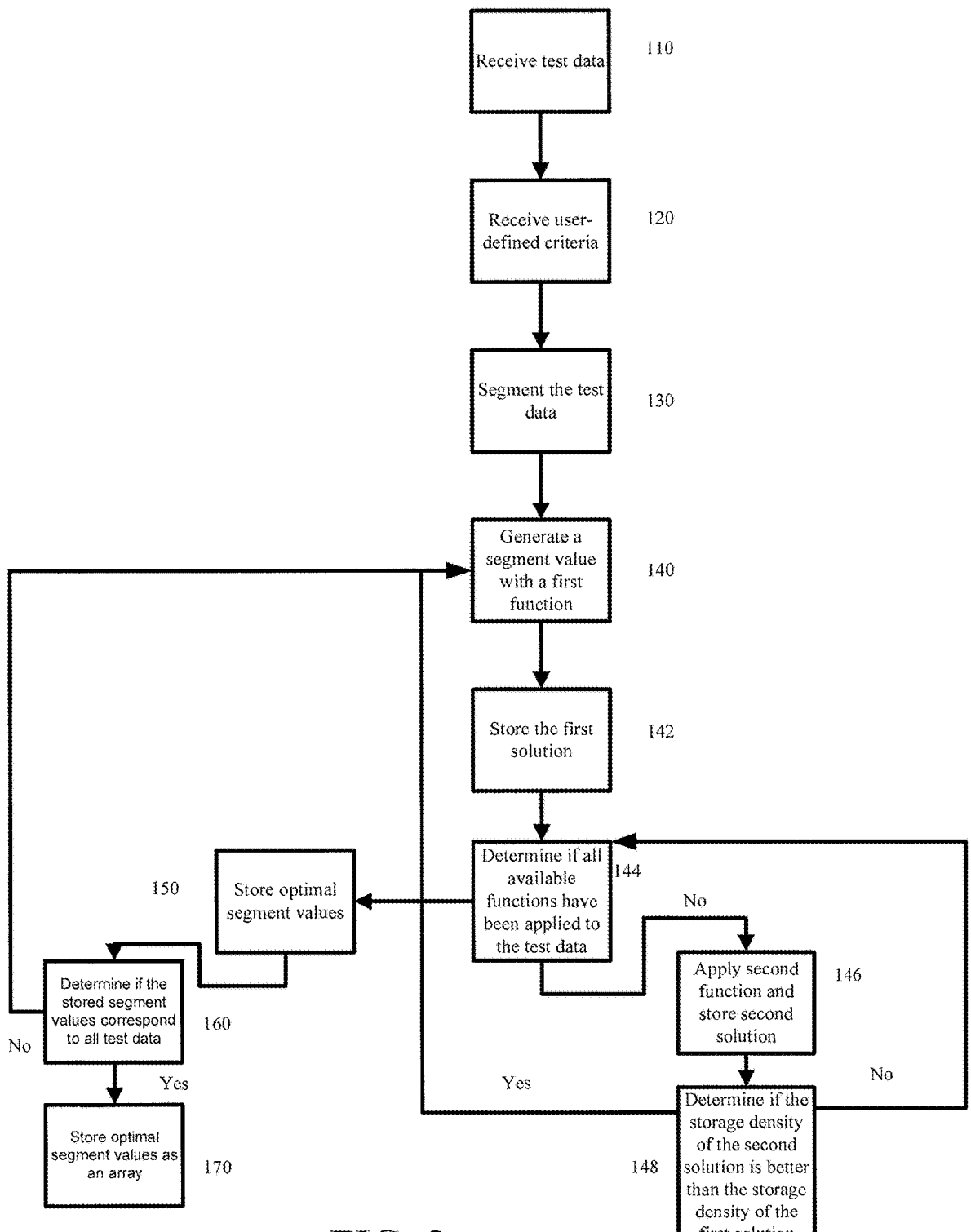
FIG. 2 is representative of a method for compensating at least one electronic oscillator of the present disclosure wherein the method further comprises utilizing a plurality of possible solution functions.

In another embodiment, illustrated by FIG. 2, the method 100 may further comprise applying a plurality of functions to the segmented test data set to thereby determine which function provides for the best fit. In one embodiment, the best fit of the data may be determined by assessing the storage density of each solution, although the present disclosure contemplates other factors may be used to assess the best fit of the data. This means that the function that can be applied while providing the maximum storage density will be selected as the best fit.

As seen in FIG. 2, generating an optimal segment value in step 140 further comprises applying a plurality of functions to the segmented test data set and storing the function that provides the best fit for the test data in step 142. In one embodiment, the plurality of functions may be stored in a database for access by a user. For example, a first function may be applied to the test data set and the corresponding first solution may be stored in an electronic memory device. A second function may then be applied to the test data set to assess a corresponding second solution in step 146. The second solution may be compared to the first solution to determine whether or not the second solution provides for a better fit of the test data in step 148. If the second solution does provide for a better fit of the test data, then the first solution stored on the electronic memory device may be overwritten with the storage of the second solution. This process can be repeated for any number of different functions to find the best fit for the test data of the functions available to the user.

In step 144 the method 100 provides for determining whether or not all of the functions available to the user have been applied to the test data set. If there are additional functions available that have not been applied, then the method 100 provides for evaluating the next available function. If there are no additional functions remaining to be applied to the test data, then the method 100 provides for storing each optimal segment value on the electronic memory device in step 150. In step 160, the method provides for determining whether or not the stored optimal segment value corresponds to the entire test data set. If so, then all of the segments may be stored as an array for easy digital access by a user in step 170. If the stored optimal segment value does not correspond to the entire test data set, then the method 100 provides for repeating steps 130-170 until the entire test data set has been solved.

Figure 3:
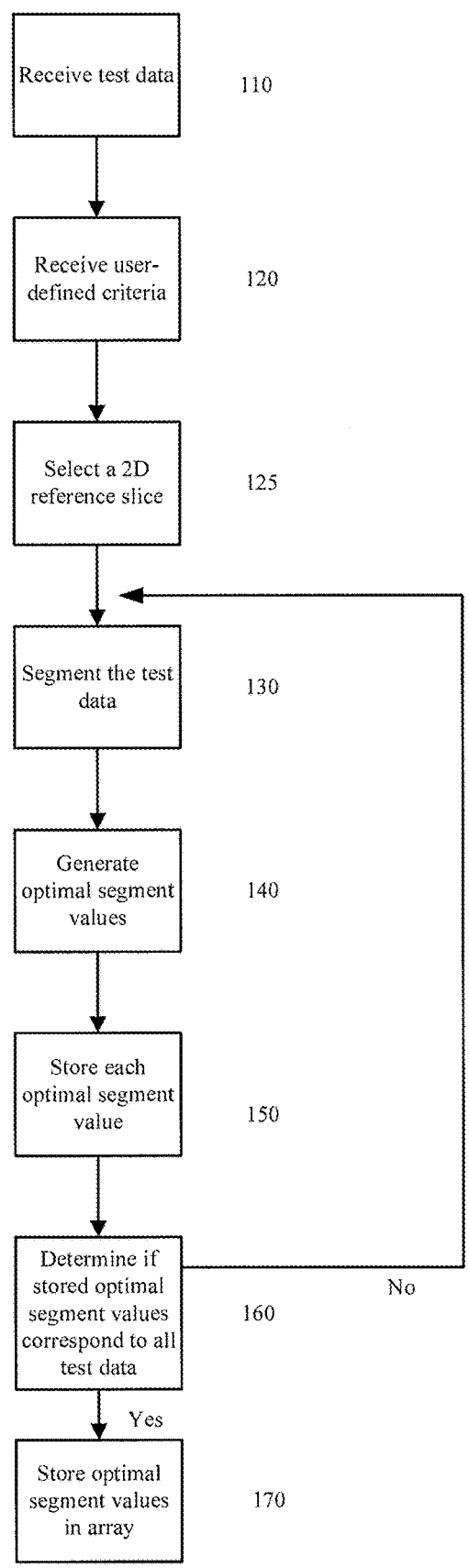
FIG. 3 is representative of a method for compensating at least one electronic oscillator of the present disclosure wherein the method further comprises utilizing three-dimensional test data and selecting a two-dimensional portion of the test data to use as a reference data set.

In yet another embodiment, illustrated by FIG. 3, the method 100 may further comprise fitting a three-dimensional data set. In such an embodiment, each segment is optimal in length relative to the user defined fit criteria. The method 100 selects a "slice" or a cross sectional portion of the two-dimensional data to use as a reference. Referring to FIG. 3, the method 100 comprises receiving a test data set in step 110 wherein the test data set is representative of the frequency output of an electronic oscillator at a plurality of data points in three dimensions (x,y,z). This test data set can be of a length n. When assessing oscillators, x may represent temperature (T), y may represent voltage (Vc), and z may represent the frequency deviation (fd). A (T, Vc, fd) data set may embody the trim effect of the response of the oscillator. Trim effect is a skewing of the frequency versus temperature performance of a crystal oscillator as the frequency is pulled (trimmed) away from the oscillator's normal frequency. As the operating point on the varactor changes due to Vc, the load capacitance the crystal sees in the feedback loop changes. The crystal's frequency versus temperature response is altered as a function of this load capacitance. This change is tolerated by most oscillator manufacturers and users, however as temperature stabilities have improved over the years this effect is becoming one of the dominant factors in thermal error. In some cases, trim effect has been observed to degrade temperature performance in excess of 10× at adjustment extremes. With oscillators, there are a host of other environmental factors that affect frequency, such as trim effect and others disclosed herein.

The method may also sense and acquire frequency versus temperature versus pressure (T, P, $f_d$). As long as the environmental parameter can be detected by a sensor and its effect on frequency is repeatable, this method can compensate for that effect.

Referring again to FIG. 3, the method 100 provides for receiving at least one set of user criteria for the test data set in step 120. As described herein, this user criterion may comprise a maximum residual error for fitting the test data set. In step 125 the method 100 provides for selecting a two-dimensional portion of the test data to use as a reference data set. This portion is then fit using the method as set forth in FIG. 1 and/or FIG. 2. This data set can be of a length n and the solution can comprise as many segments as are needed to meet the maximum residual error defined for the test data.

The method 100 may further comprise segmenting the test data set into a plurality of segments in step 130. In one embodiment, the length of each segment may be determined by applying the user criteria, such as the maximum residual error. In this embodiment, the method 100 creates a new segment, that is a function of temperature (T) and control voltage (Vc). This function $h(T, V_c)$ is created by having a polynomial of form $a_n V_c^n + a_{n-1} V_c^{n-1} + \ldots + a_0$, where the coefficients $a_n, a_{n-1}, \ldots, a_0$ are unique polynomial functions of T. For example, $a_n = b_n T^n | b_{n-1} T^{n-1} + \ldots + b_0$. This is necessary because the change in reference performance is a function of both temperature and control voltage. By having independent degrees of freedom the method may fit this characteristic to very low residual error.

In step 140, the method 100 provides for generating an optimal segment value for each segment in the test data set by applying at least one function to each of the segments created in step 130. To generate each optimal segment value, the method 100 may comprise applying one or more algorithmic techniques to the test data to determine one or more functions that may be applied while meeting the maximum residual error specified by the user. In step 150 each optimal segment value may be stored on an electronic memory device. As discussed herein, each optimal segment value may comprise one or more coefficients for each function, a start value, a stop value, and any scaling values that may be needed to facilitate a digital hardware implementation of the method 100.

In step 160, the method 100 provides for determining whether or not the stored optimal segment values correspond to the entire test data set. If so, then the method 100 provides for storing each optimal segment value in an array in step 170. If the stored optimal segment values do not correspond to the entire data set, then the method 100 provides for repeating steps 130-170 until the stored optimal segment values correspond to the entire data set.

The present disclosure further provides for a non-transitory storage medium containing machine readable program code, which, when executed by a processor, causes the processor to perform the following: (a) receive a test data set representative of the frequency output of an electronic oscillator at a plurality of data points in at least two dimensions, wherein each data point corresponds to at least one environmental parameter; (b) receive at least one set of user criteria for the test data set; (c) segment the test data set into a plurality of segments, wherein the length of each segment is determined by applying the user defined criteria; (d) generate an optimal segment value for each segment in the test data set by applying at least one function to the segments; store each optimal segment value on at least one electronic memory device; and determine whether or not the stored optimal segment value corresponds to the entire test data set, and (i) if the stored optimal segment values do correspond to the entire test data set, store the optimal segment values as an array, and (ii) if the stored optimal segment values do not correspond to the entire test data set, repeat steps (b)-(f) until the optimal segment values are stored for the entire test data set.

The test data set may comprise at least one of a control voltage, an environmental parameter, and a frequency deviation. The non-transitory storage medium, when executed by a processor may further cause the processor to apply each optimal segment value to each segment of the test data set to thereby generate one or more correction voltages. Optimal segment values and the resulting stored array may further comprise at least one of: a coefficient for a function, a start value, a stop value, and a scaling value. The correction voltage may be applied to the oscillator to compensate the oscillator for one or more environmental parameters.

The non-transitory storage medium, when executed by a processor, may further cause the processor to apply a function to each segment of the test data using at least one algorithmic technique and to evaluate a plurality of functions and select the function that provides the best fit. As described herein, the solutions of each function can be compared with the solution of a previously applied function to determine whether or not a better fit has been achieved. Best fit may be determined based on optimal storage density, while maintaining compliance with the user-defined error limit.

Figure 4:
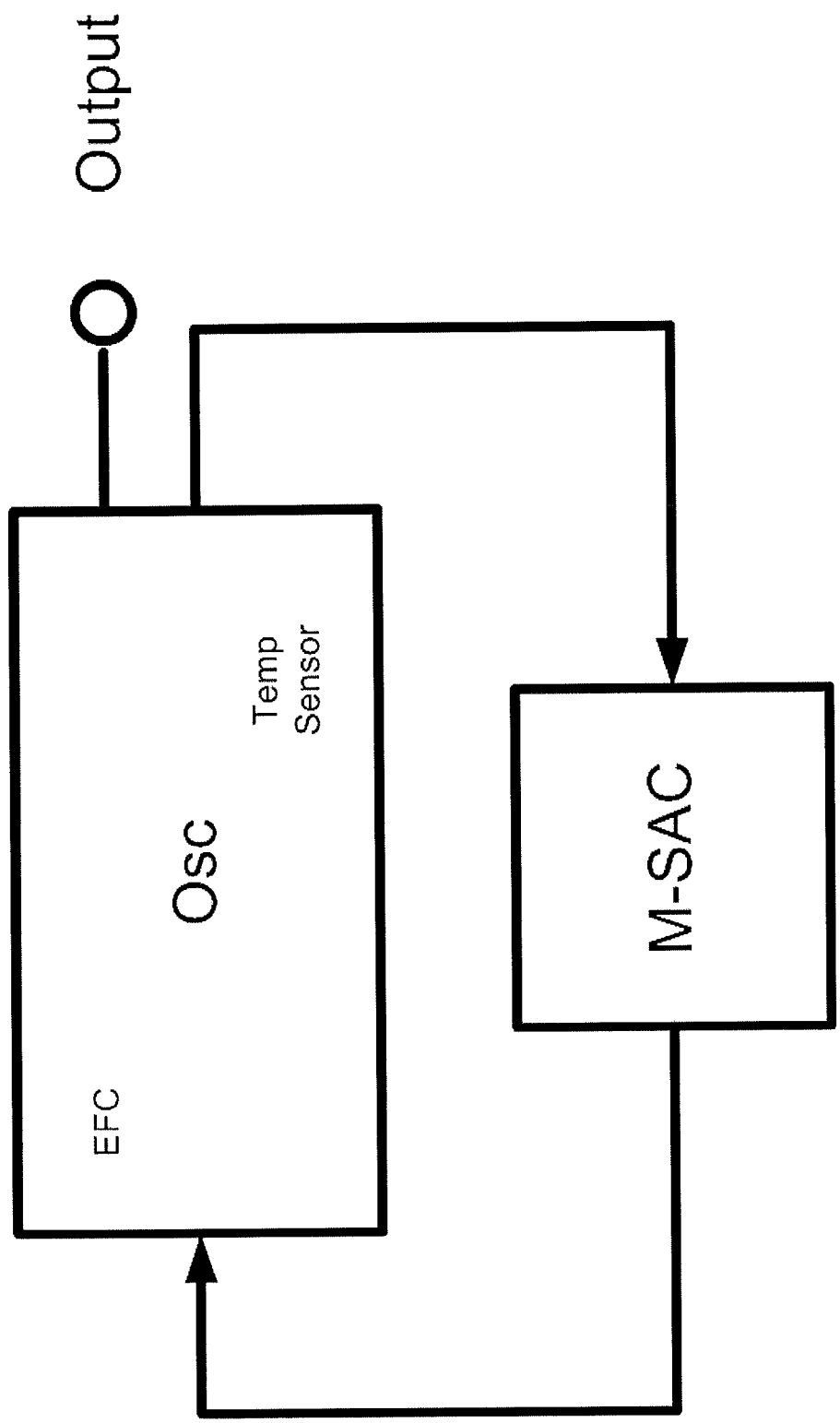
FIG. 4 is representative of a system of the present disclosure for compensating an electronic oscillator for temperature effects where there is no user electric frequency control ("EFC") and a temperature sensor, such as a digital thermometer, is internal to the oscillator.

The present disclosure further provides for a system for compensating electronic oscillators for environmental parameters. In several embodiments, illustrated by FIG. 4-FIG. 7, the system may be configured so as to compensate for the effects of temperature on the oscillator. The system can be used where the M-SAC is the only compensation or as a secondary compensation to a compensation mechanism already present in the oscillator. Examples of other compensation methods that may be used in conjunction with the M-SAC, and examples of oscillators that may be compensated using this configuration, include but are not limited to: a crystal osciallator, a temperature compensated crystal oscillator ("TCXO"), an oven controlled crystal oscillator ("OCXO"), a voltage controlled crystal oscillator ("VCXO"), a temperature compensated voltage controlled crystal oscillator ("TCVCXO"), a voltage controlled, temperature compensated crystal oscillator ("VCTCXO"), a voltage controlled, oven controlled crystal oscillator ("VCOCXO"), a double oven controlled crystal oscillator ("DOCXO"), a voltage controlled, double oven controlled crystal oscillator ("VCDOCXO"), a rubidium oscillator, a cesium oscillator, a microelectromechanical systems ("MEMS") oscillator with native compensation, an electronic oscillator with native compensation, and others. VCTCXOs and TCVCXOs are both voltage controlled devices which means that these devices are able to be adjusted in frequency with a voltage. However, these devices have different levels of implied precision. Generally, TCXOs are assumed to be a more precise device and provide for better temperature stability performance as it is temperature compensated. The VCXO is assumed to have less precision, but a higher degree of adjustability. With a VCTXO, the assumption is that the device is a high precision part with frequency adjustability. With a TCVCXO, the assumption is that the device has a large amount of frequency adjustability and better temperature stability than a VCXO, but not a great as a TCXO. FIG. 4 is representative of a system of the present disclosure for compensating an electronic oscillator for temperature effects where there is no user electric frequency control ("EFC") and a temperature sensor is internal to the oscillator. Here, the oscillator may be configured to send one or more output signals to the M-SAC module where the output signal comprises test data representative of the frequency output of the oscillator at a plurality of data points corresponding to at least one environmental parameter. The temperature sensor is configured to detect changes in temperature and send this information to a M-SAC module. The M-SAC module then generates one or more correction voltages for the oscillator by processing the test data for the given temperature.

Figure 5:
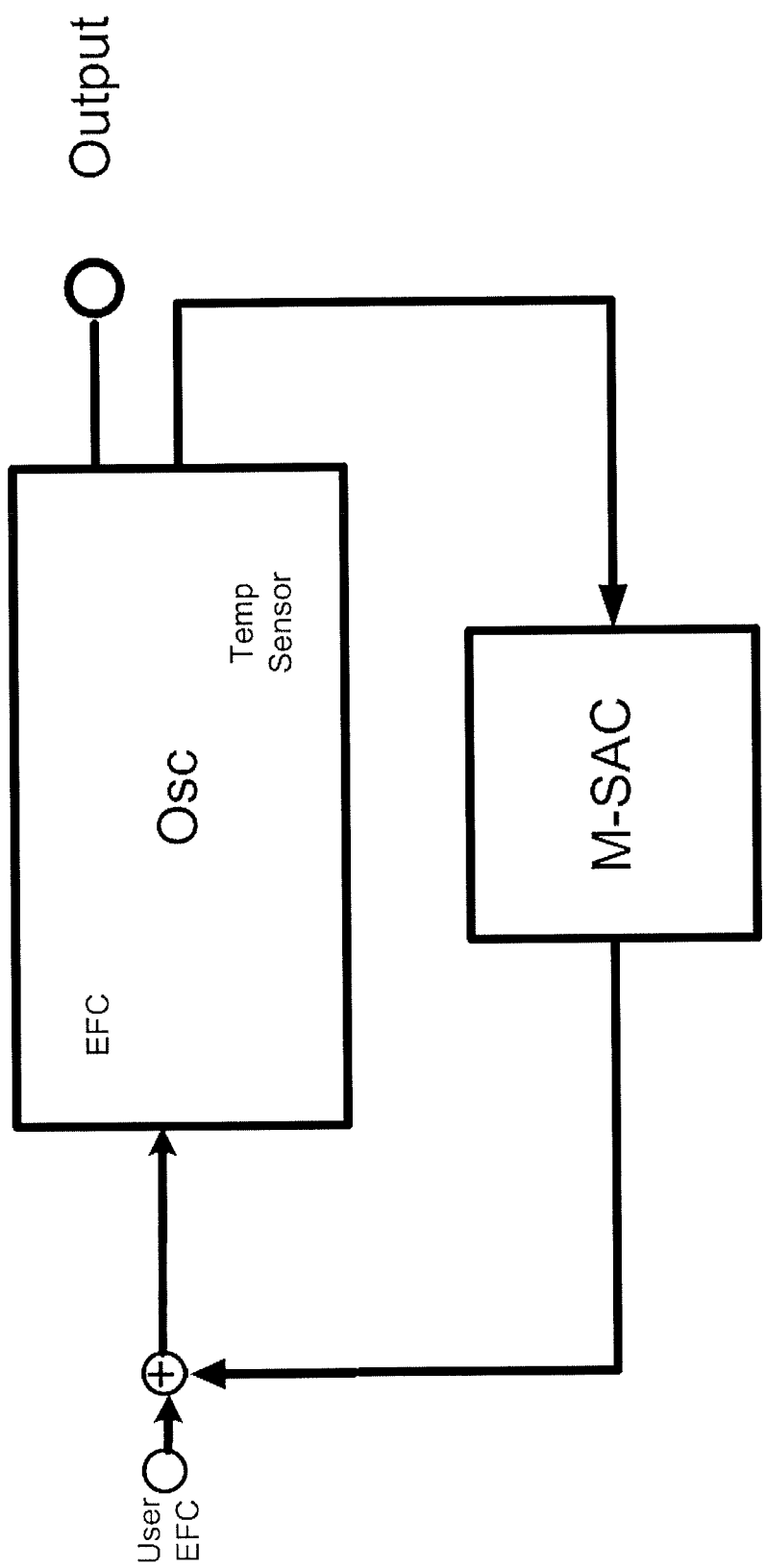
FIG. 5 is representative of a system of the present disclosure for compensating an electronic oscillator for temperature effects further comprising user EFC and an internal temperature sensor.

FIG. 5 is representative of a system comprising a user EFC and an internal temperature sensor. A temperature sensor located inside of the oscillator will provide better temperature tracking as the goal is to have the temperature sensor as closely thermally coupled to the resonator as possible. However, if a user is utilizing a finished off-the-shelf oscillator from a commercial manufacturer, for use in a larger system, the user may need to use a sensor that is external to the oscillator.

Figure 6:
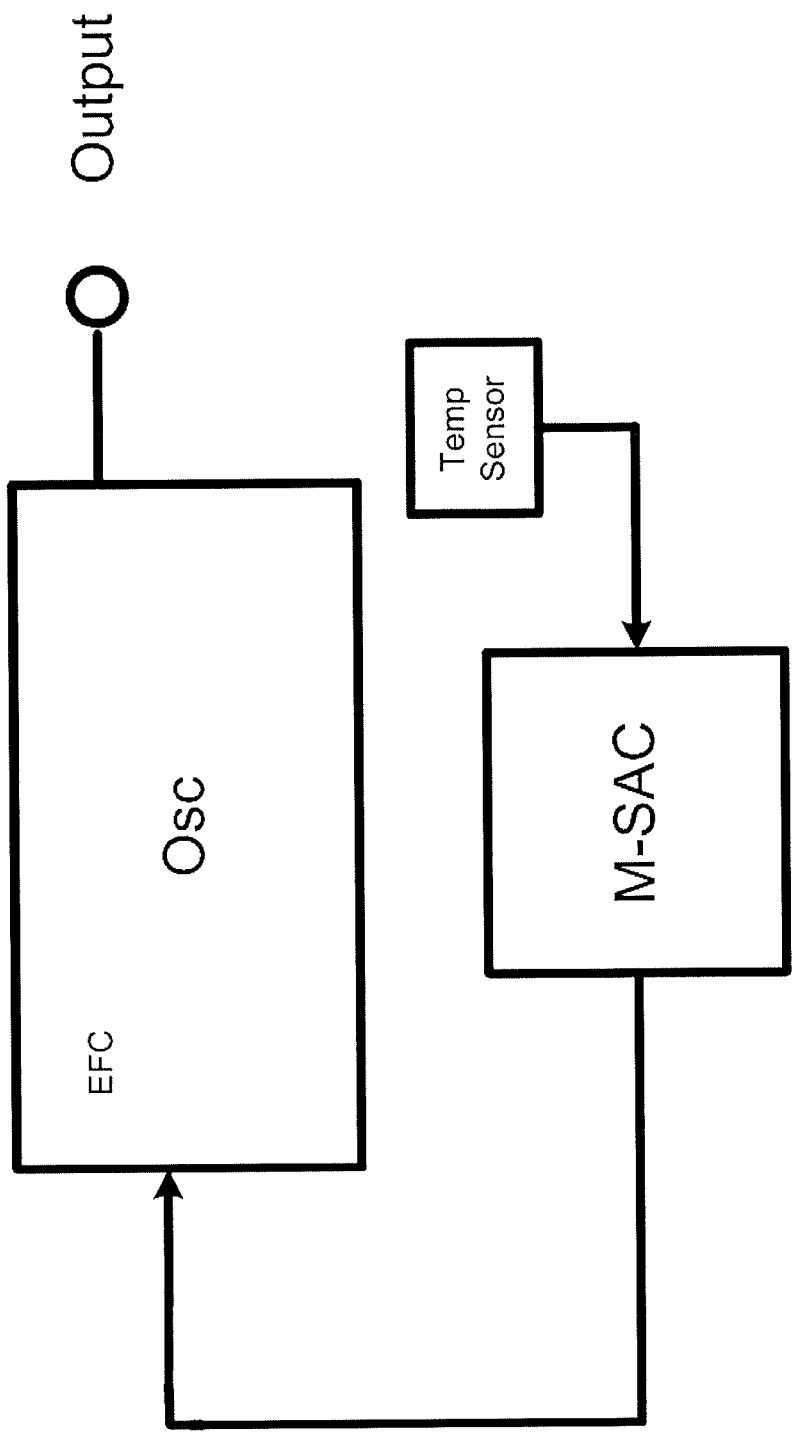
FIG. 6 is representative of a system of the present disclosure for compensating an electronic oscillator for temperature effects where there is no user EFC and an external temperature sensor.
Figure 7:
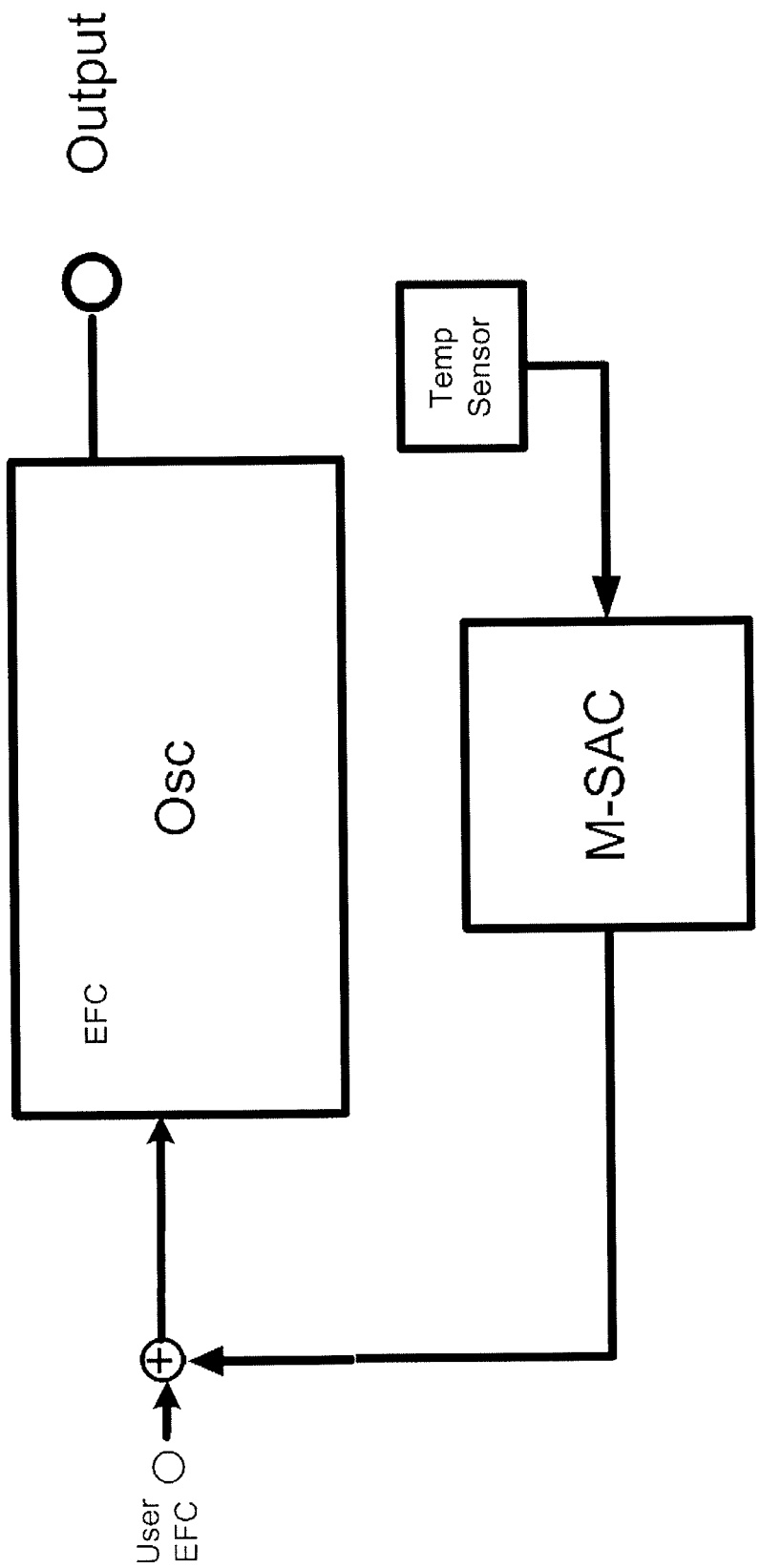
FIG. 7 is representative of a system of the present disclosure for compensating an electronic oscillator for temperature effects further comprising a user EFC and an external temperature sensor.

Embodiments of the present disclosure that contemplate an external temperature sensor are represented by FIG. 6 (without user EFC) and FIG. 7 (with user EFC). The system of FIG. 6 comprises an external temperature sensor which is operably coupled to a M-SAC module. The M-SAC module assesses the information received by the temperature sensor and generates one or more correction voltages to which can be applied to the oscillator to compensate for temperature effects. In FIG. 7, the system may further comprise a user EFC. Such embodiments enable a user to compensate an oscillator to achieve better performance than the oscillator would have achieved otherwise.

Table 1 below illustrates the format of an exemplary array for temperature compensation according to the present disclosure. A start temperature is provided for each function. An end temperature is not necessary because the start temperature of the next segment is known. In one embodiment, the functions may be the same. In another embodiment, the functions may comprise two or more different functions. Examples of functions contemplated by the present disclosure include but are not limited to polynomial (order zero through n), logarithmic, exponential, and sigmoid, among others. The user may define which functions are used (the user-defined criteria) however certain functions may provide a better fit for certain types of test data. Each function will have a unique coefficient. For quartz oscillators, smooth continuous functions such as polynomials and sigmoids hold potential for providing good fit results.

TABLE 1

| Start Temperature | Function Code | Coefficient 1 $a_1$ | Coefficient 2 $a_2$ | Coefficient n $a_n$ |
|---|---|---|---|---|
| $T_1$ | $f_1(x)$ | $a_{11}$ | $a_{12}$ | $a_{1n}$ |
| $T_2$ | $f_2(x)$ | $a_{21}$ | $a_{22}$ | $a_{2n}$ |
| $T_3$ | $f_3(x)$ | $a_{31}$ | $a_{32}$ | $a_{3n}$ |
| $T_n$ | $f_n(x)$ | $a_{n1}$ | $a_{n2}$ | $a_{nn}$ |

Figure 25:
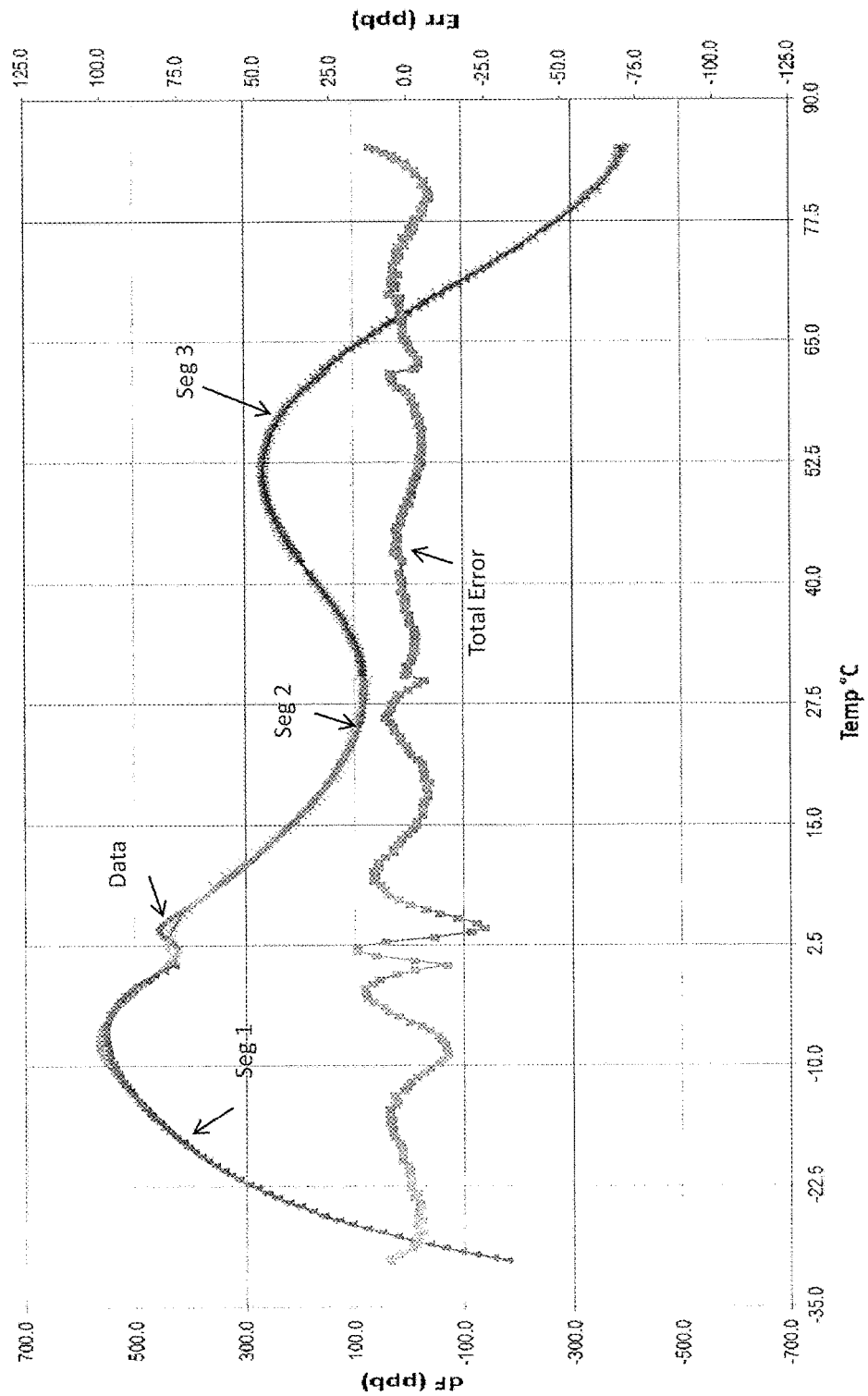
FIG. 25 is representative of a 3 segment, 21 storage element, M-SAC curve fit solution of the data originally presented in FIG. 17.

Table 2 below and FIG. 25 are representative of an exemplary test data set and curve fit using the M-SAC module where only $4^{th}$ order polynomials were utilized in the solution.

TABLE 2

| Start Temp | Func Code | Function Coefficients | | | | |
|---|---|---|---|---|---|---|
| | | f | e | d | c | b | a |
| −30.211 | 4 | | −5.5585351E02 | 4.1792493E03 | −1.1793783E04 | 1.4806890E04 | −6.9765251E03 |
| 0.898 | 4 | | −4.8216616E02 | 4.1701015E03 | −1.3511581E04 | 1.9436767E04 | −1.0470931E04 |
| 30.461 | 4 | | 1.2512320E02 | −1.2431078E03 | 4.6171919E03 | −7.5993811E03 | 4.6791711E03 |

Figure 8:
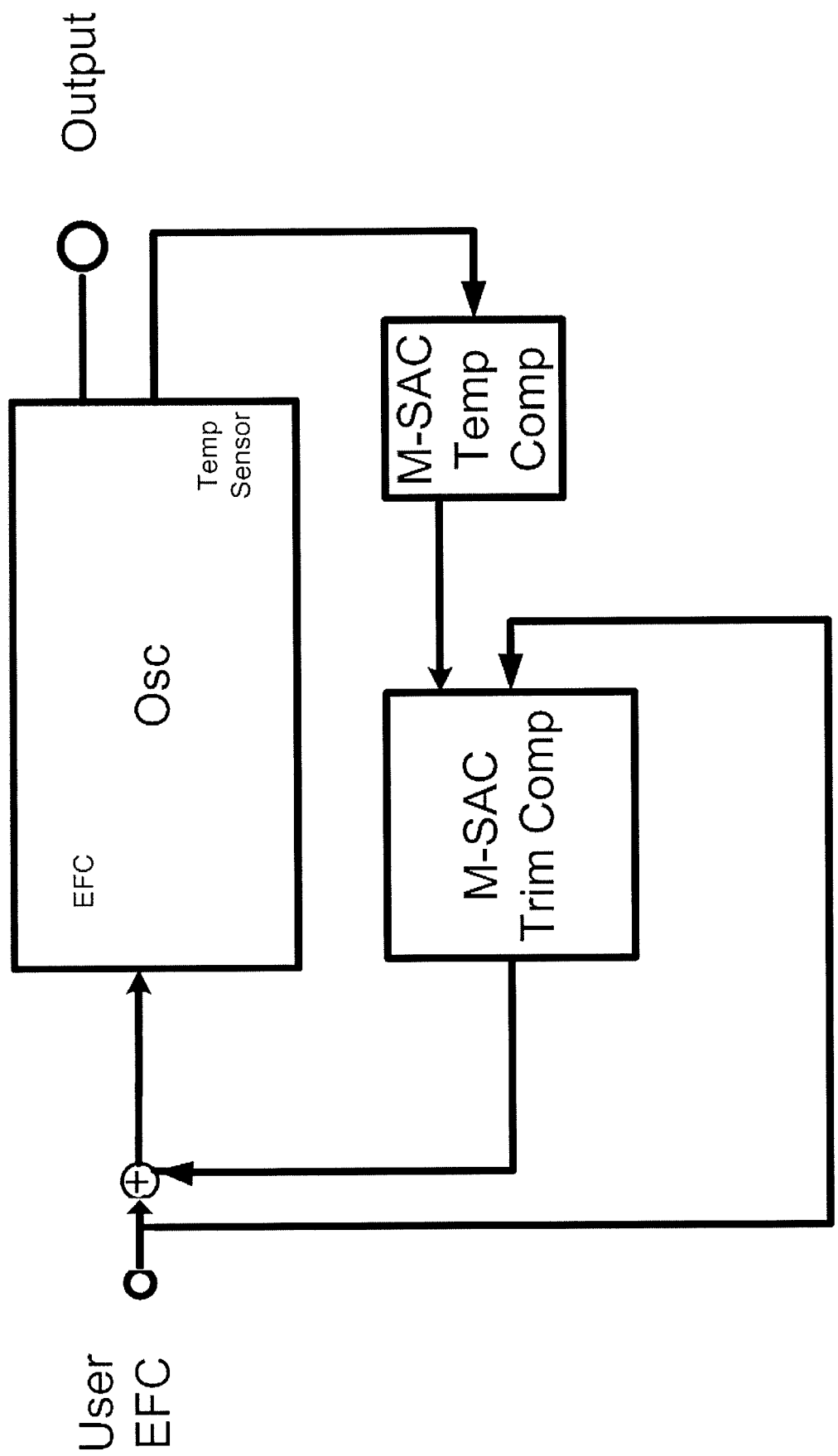
FIG. 8 is representative of a system of the present disclosure for compensating an electronic oscillator for trim effect and temperature effects further comprising a user EFC and an internal temperature sensor.
Figure 26:
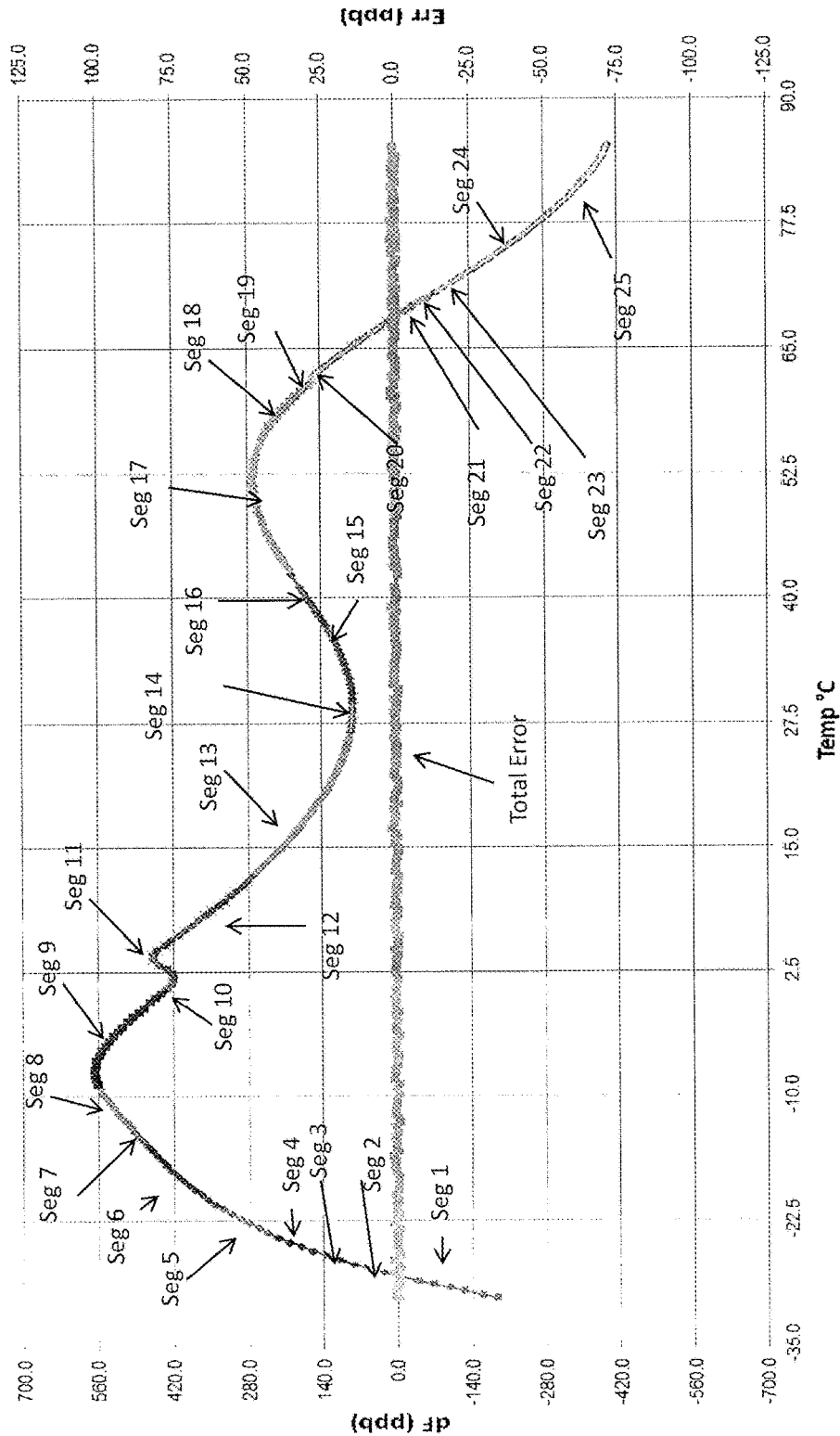
FIG. 26 is representative of a 25 segment, 132 storage element, M-SAC curve fit solution of the data originally presented in FIG. 17 where the error tolerance was reduced in an attempt to achieve optimal curve performance.

FIG. 25 illustrates frequency deviations in the test data over a defined temperature range. FIG. 26 illustrates optimized exemplary curve fitting results using the M-SAC system and method disclosed herein. As can be seen from the Figures, each segment of the test data may be fit based on a user-defined maximum residual error to correct the frequency output of an oscillator for changes in temperature. The present disclosure is not limited to temperature compensation and it is contemplated that oscillators may be compensated for a variety of other environmental parameters using the system and method disclosed herein. For example, FIG. 8 is representative of a system for compensating an oscillator for trim effect and temperature effects. Trim effect is a skewing of the frequency versus temperature characteristic of an oscillator as a function of the applied EFC. This skewing is generally tolerated as being inherent to TCXOs and VCXOs however it can be fit and compensated with this method. In one embodiment, the method may comprise running the oscillator at a fixed EFC and solving the temperature compensation array first. Then the compensated unit may be run over temperature again, this time sweeping the EFC over a functional range at various temperatures to generate the test data to be fit. The test data describes how the frequency versus temperature characteristic changes as a function of EFC. This array is then solved to map that changing characteristic.

Figure 9:
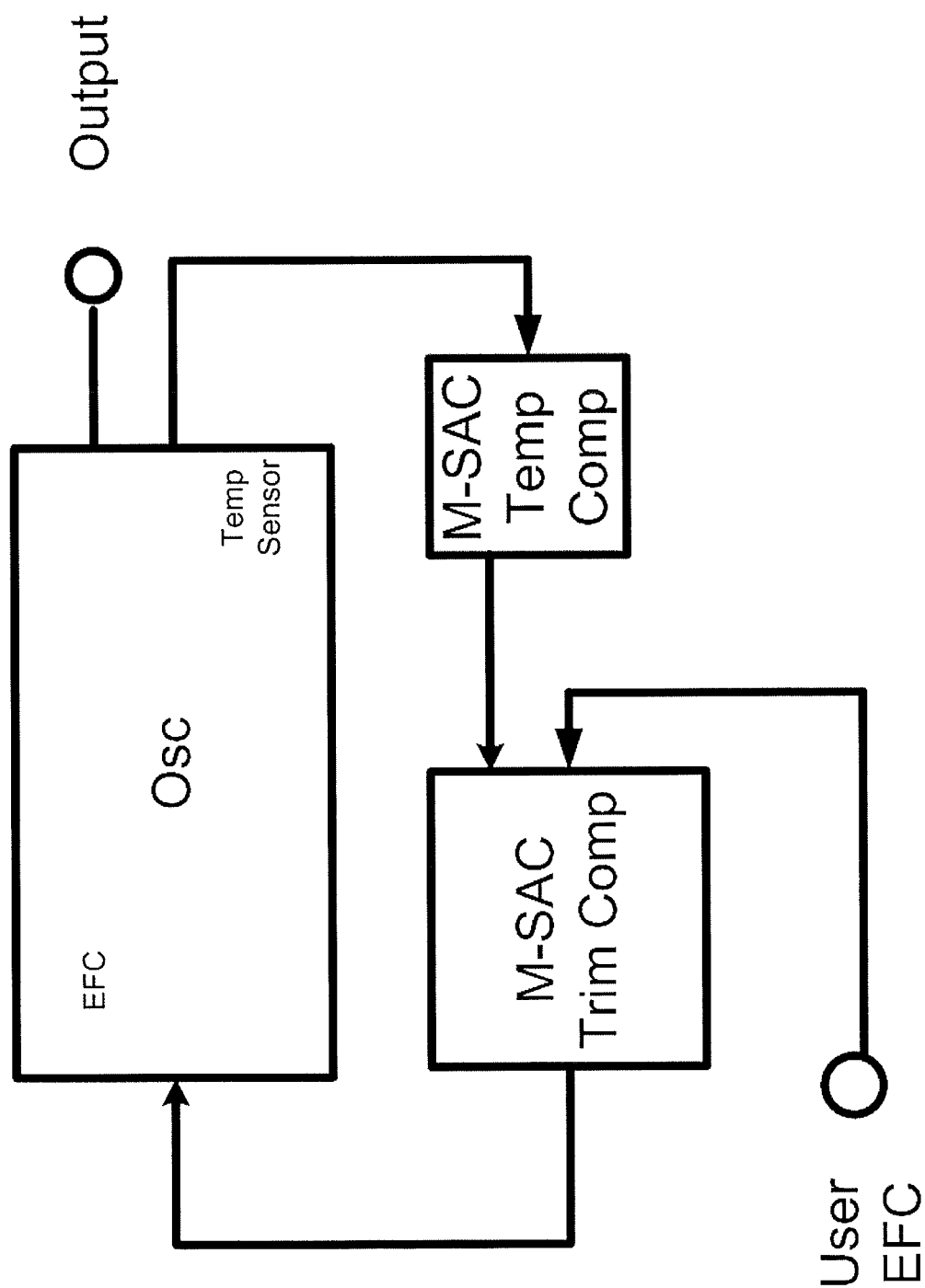
FIG. 9 is representative of a system of the present disclosure for compensating an electronic oscillator for trim effect and temperature effects where there is no physical connection between a user EFC and the oscillator.

The embodiment of FIG. 8 comprises a M-SAC module configured to process test data and generate one or more voltages that can be applied to the oscillator to compensate for trim effect. The system further comprises a M-SAC module configured to process test data and generate one or more correction voltages that can be applied to the oscillator to compensate for temperature effects. The embodiment of FIG. 8 comprises a user EFC and an internal temperature sensor. The user EFC is connected to the oscillator but it may also be sampled so that it can be input into an array. The array may calculate the correct value to compensate for the EFC value and temperature the oscillator is at. This embodiment may be useful for oscillators that may have a modulated EFC. However, other configurations may comprise systems where there is no physical connection between the user EFC and the oscillator, as illustrated in FIG. 9. Here, the M-SAC module recognizes the user's input and calculates a compensation voltage for the oscillator. This compensation may off-set the need for a user EFC. This embodiment holds potential for application in non-modulated units, where solution speed is not a critical factor.

Figure 10:
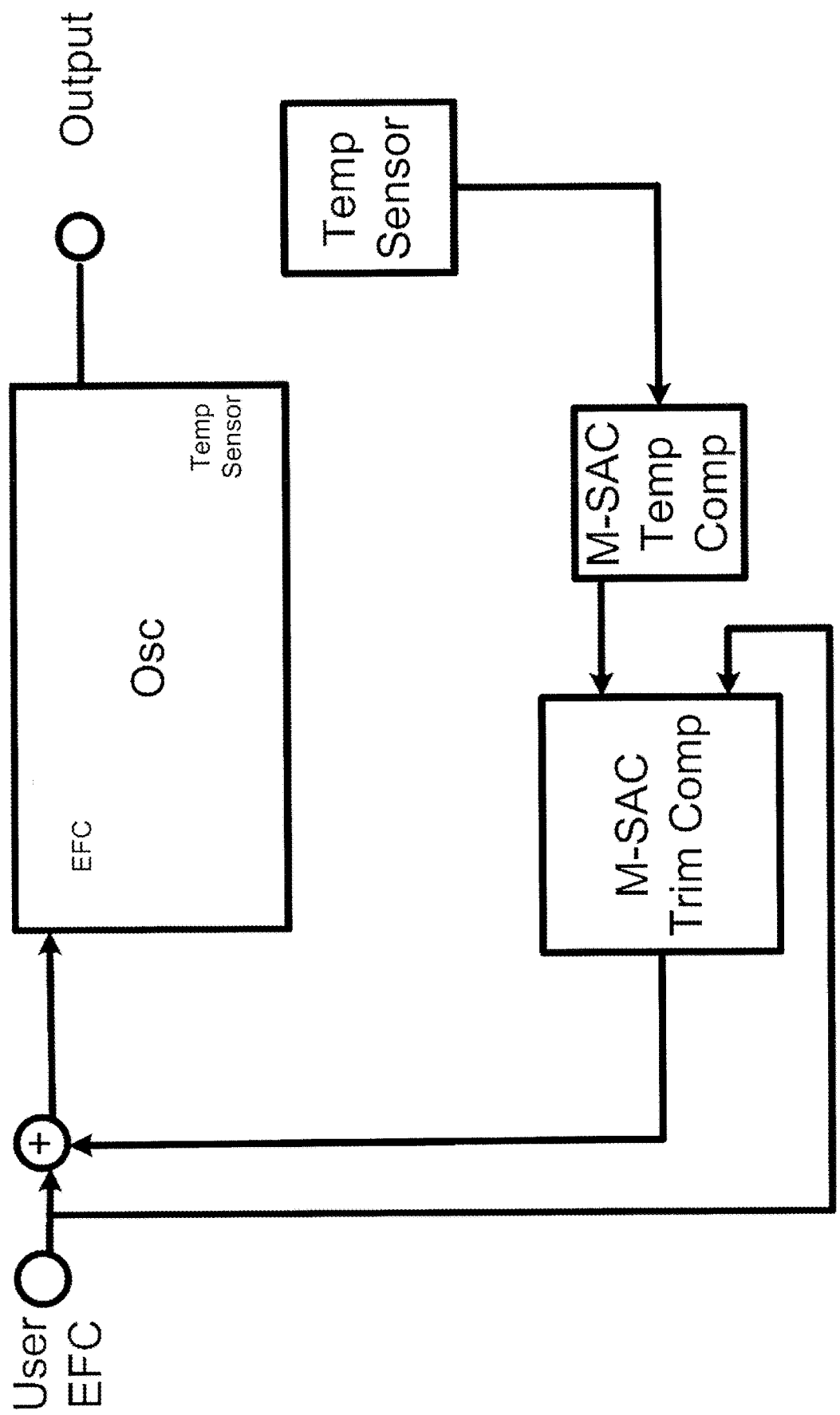
FIG. 10 is representative of a system of the present disclosure for compensating an electronic oscillator for trim effect and temperature effects where a user EFC is physically connected to the oscillator.
Figure 11:
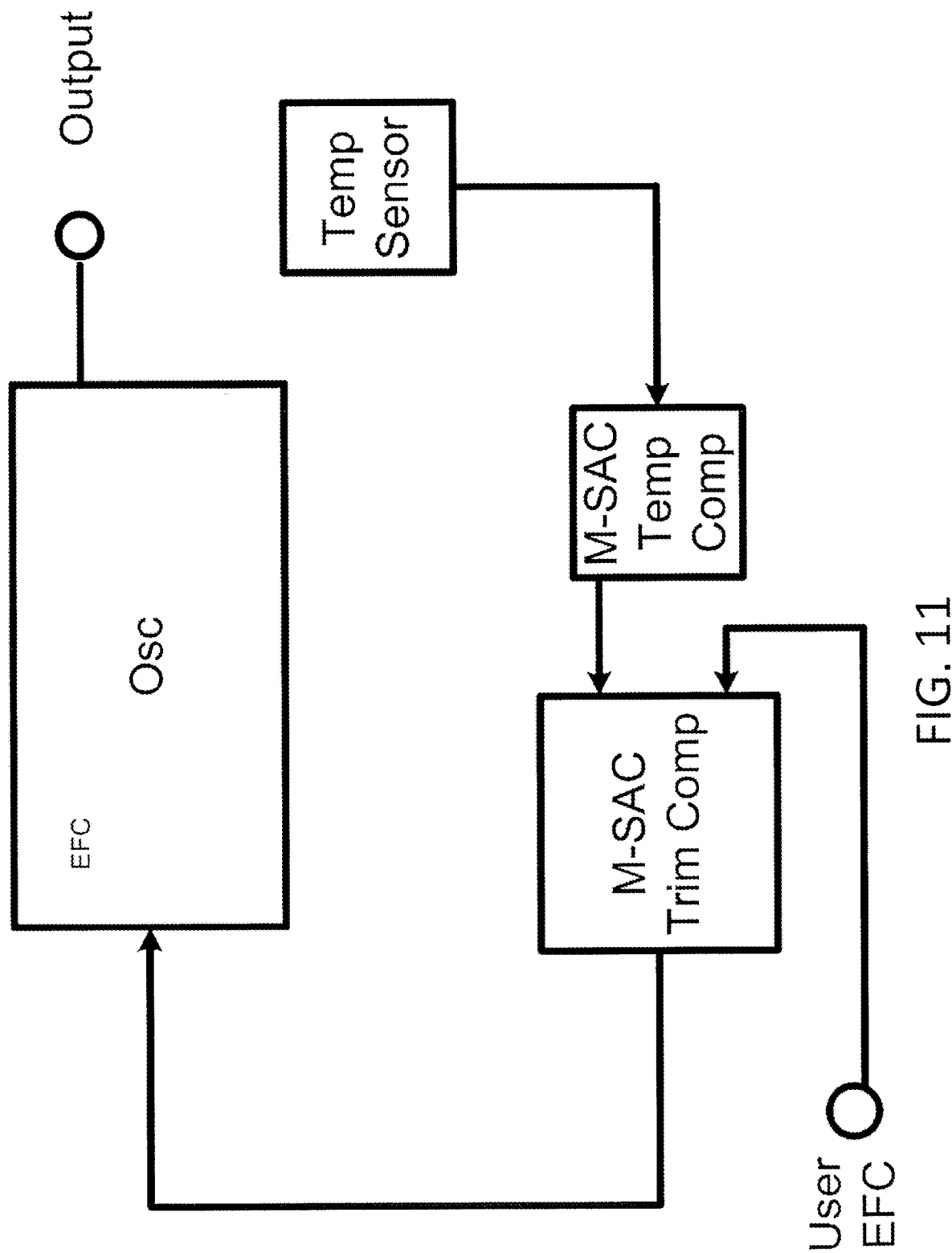
FIG. 11 is representative of a system of the present disclosure for compensating an electronic oscillator for trim effect and temperature effects where there is no physical connection between the user EFC and the oscillator and where the system further comprises an external temperature sensor.

FIG. 10 and FIG. 11 illustrate additional embodiments for compensating an oscillator for trim effect and temperature effects. In FIG. 10, a user EFC is physically connected to the oscillator and wherein the oscillator comprises an internal temperature sensor. In FIG. 11, the user EFC is not physically connected to the oscillator and the temperature sensor is external to the oscillator.

In other embodiments, the system and method of the present disclosure may be applied for linearity compensation. The EFC available to the user on many modern oscillators allows the user to adjust the frequency with an external voltage. For example, this calibration may be used for routine calibration to offset for effects corresponding to an oscillator's age. The EFC can also be used to implement the oscillator in a Phase Lock Loop ("PLL") in certain applications.

Regardless of the application, it is desirable that the frequency change be linear with respect to the control voltage. In practice, the non-linearity of oscillators can vary from a couple percent to tens of percent. This non-linearity is generally assumed to be inherent because of the way frequency change is created. In most oscillators this frequency change happens because a varactor is on the feedback loop of the oscillator. The user EFC voltage is applied to this varactor. As that voltage changes, the varactor's capacitance changes which changes the feedback loop capacitance, which results in a different oscillation frequency. Varactors are non-linear by nature and this coupled with temperature effects leads to a non-linear tuning curve. The system and method disclosed herein hold potential for fitting the inherent tuning characteristic and mapping it to a more linear state. This linearity compensation can be stand alone or coupled with the above temperature compensation, trim effect compensation, or compensation of any other environmental parameter.

Figure 12:
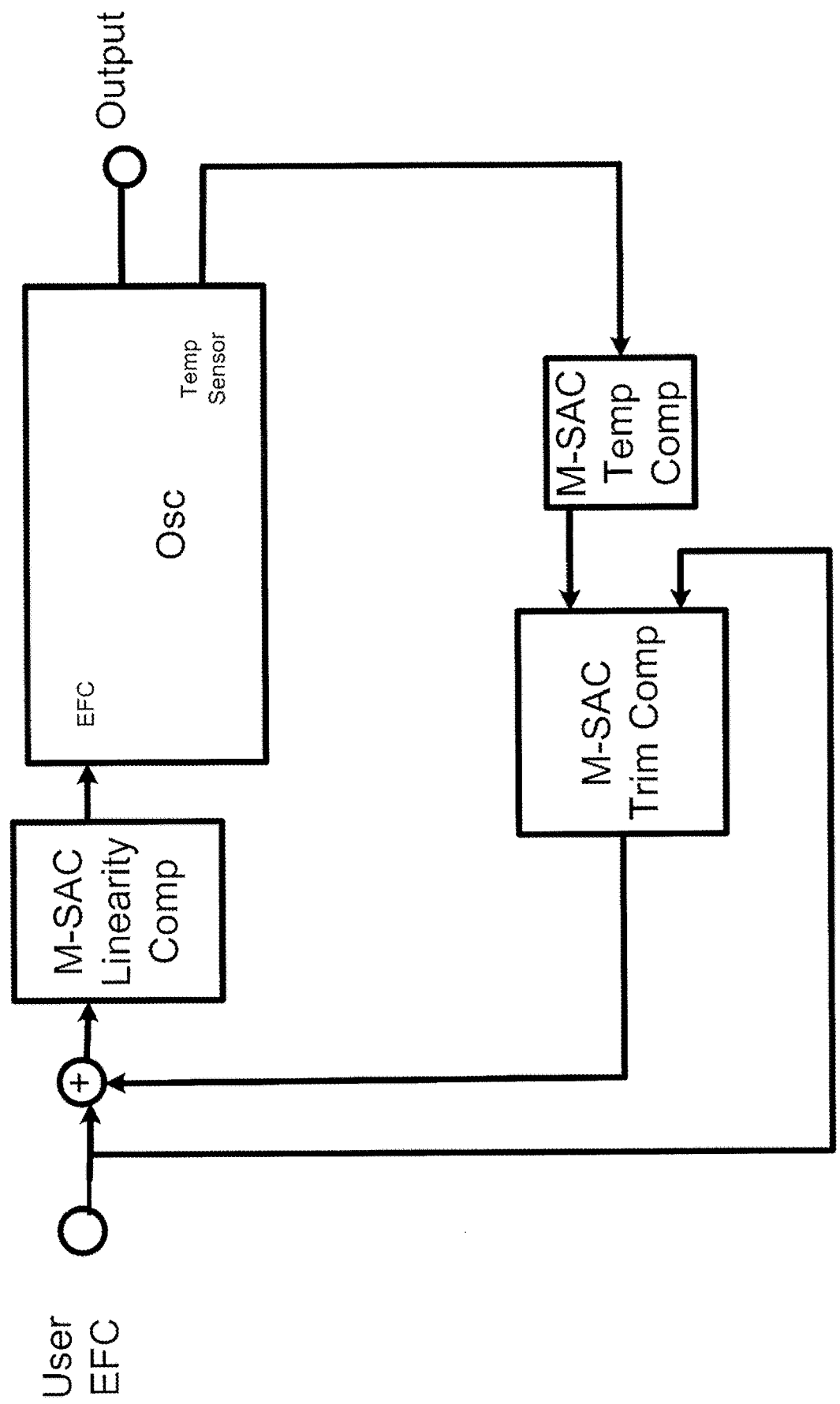
FIG. 12 is representative of a system of the present disclosure for compensating an electronic oscillator further configured for slow speed updates.
Figure 13:
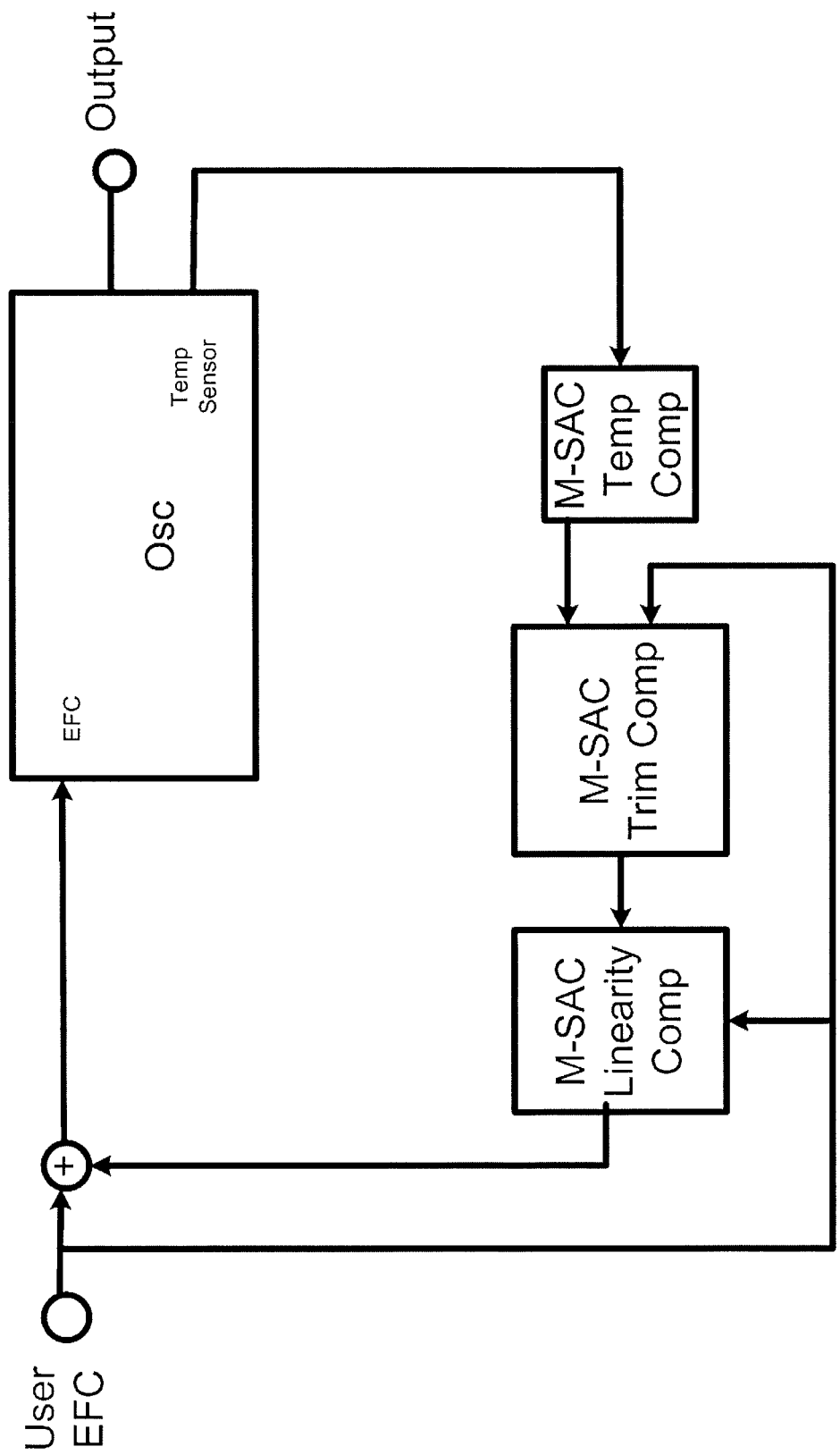
FIG. 13 is representative of a system of the present disclosure for compensating an electronic oscillator further configured for high speed applications.
Figure 14:
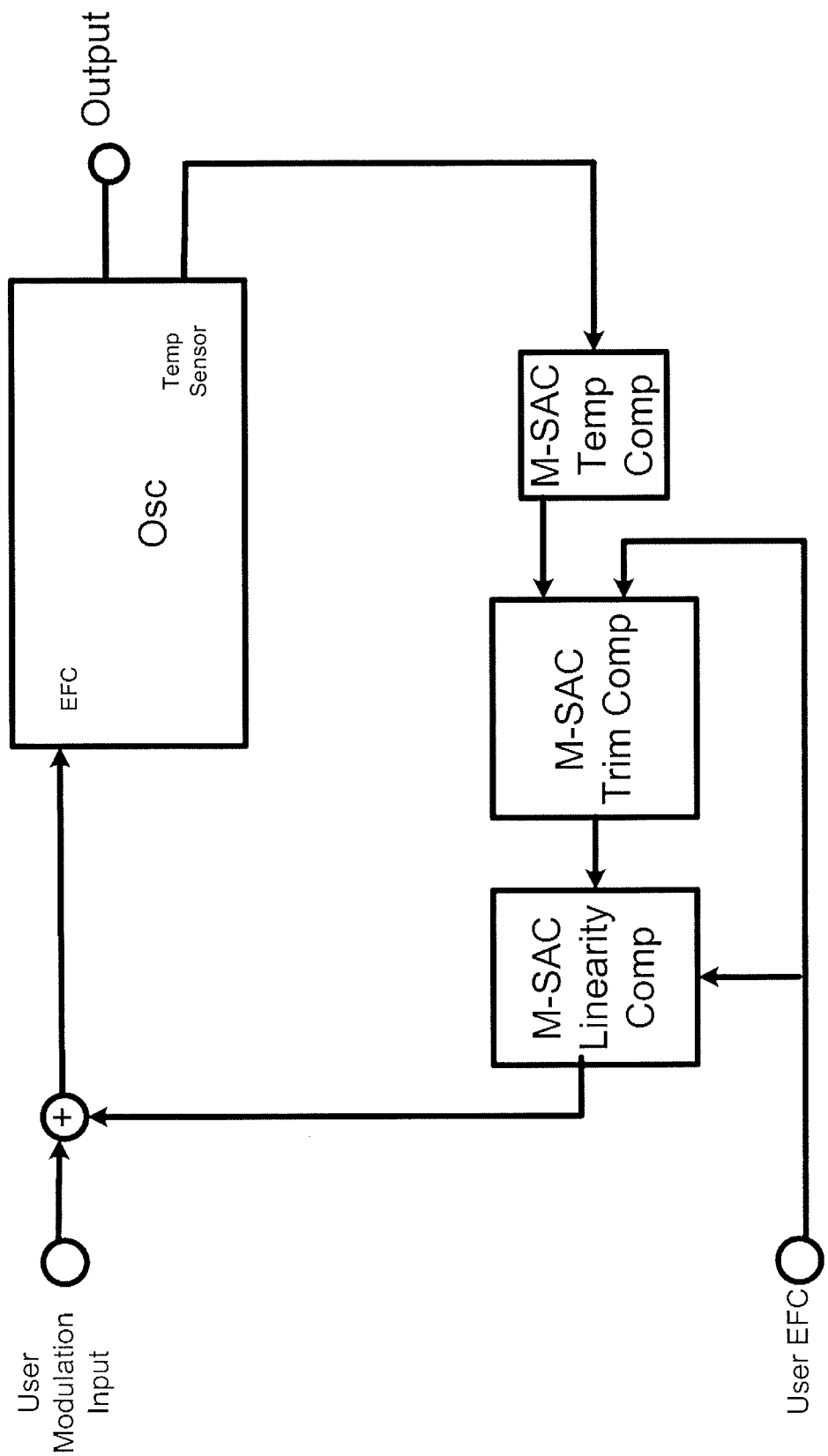
FIG. 14 is representative of a system of the present disclosure for compensating an electronic oscillator comprising a separate modulation signal input.
Figure 15:
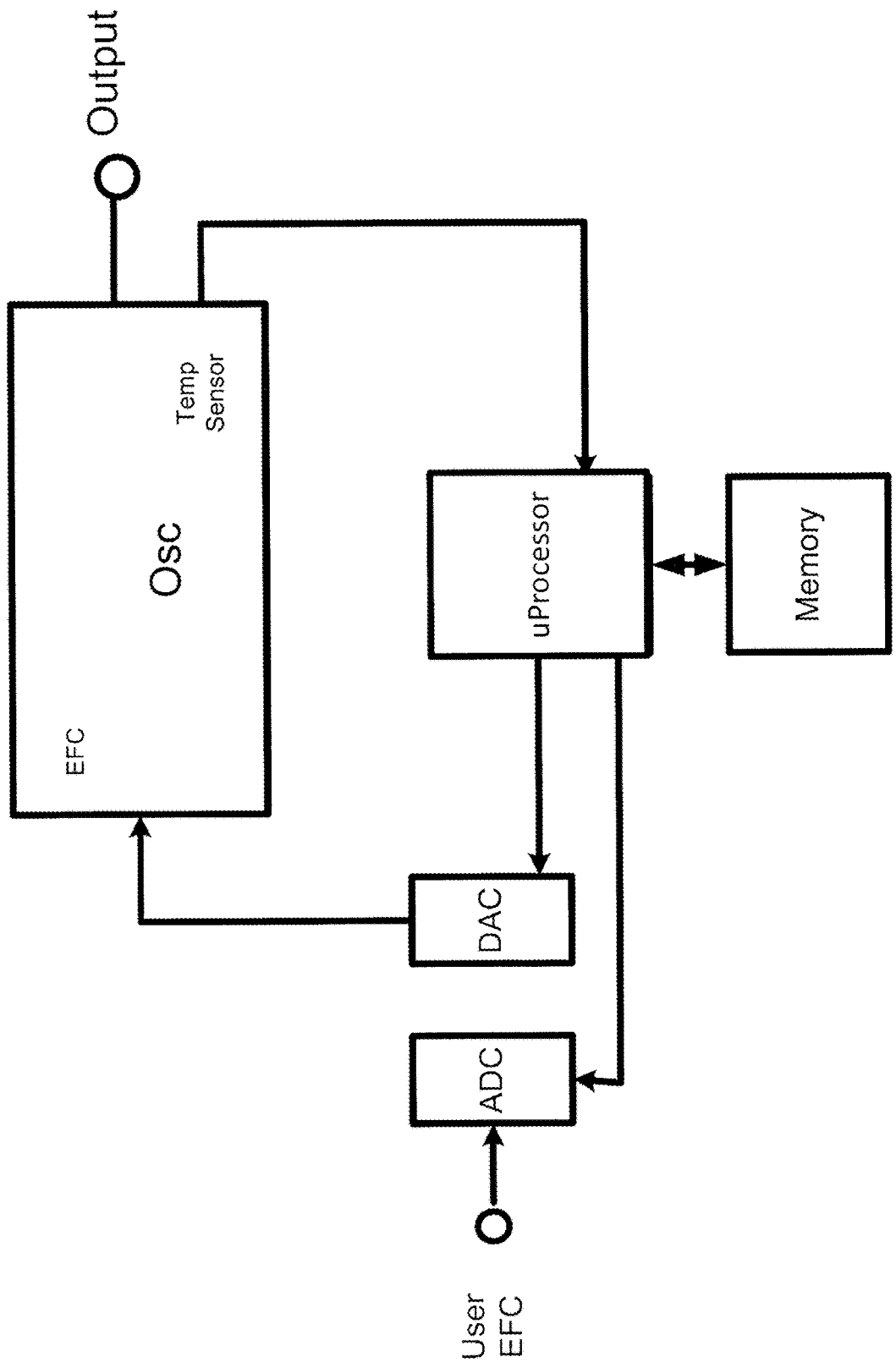
FIG. 15 is representative of a system of the present disclosure for compensating an electronic oscillator further comprising an integrated or embedded temperature sensor.
Figure 16:
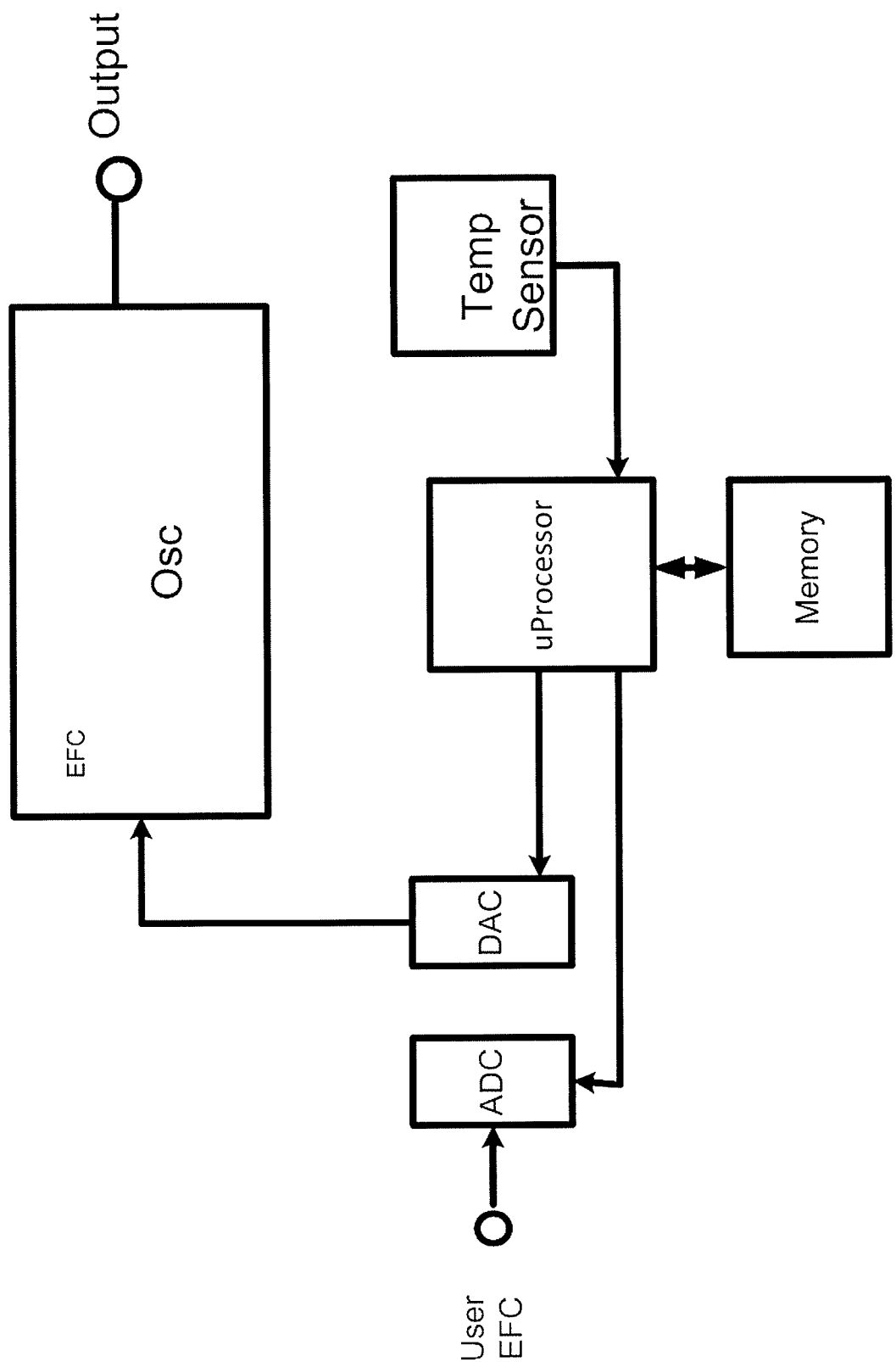
FIG. 16 is representative of a system of the present disclosure for compensating an electronic oscillator further comprising an external temperature sensor.

Another embodiment that holds potential for modulated oscillators is illustrated in FIG. 11. Here, the modulation signal is kept separate from the frequency voltage adjustment, allowing for better compensation of the desired quantity and a lower distortion of the modulation frequency. In one embodiment, illustrated by FIG. 12, the system may comprise a plurality of M-SAC modules, each dedicated to solve the test data for a different environmental parameter such as linearity, trim effect, and temperature. The configuration of FIG. 12 holds potential for applications where slow solution speed is not a factor. For faster applications, the configuration of FIG. 13 may be used. Here, the user's voltage passes directly to the oscillator but sampled to determine the DC component of the signal and adjust for the linearity and trim effect compensations. These configurations provide for an oscillator with an internal or external temperature sensor operably coupled to a processor, which may store one or more M-SAC modules. A memory device may be coupled to the processor to store a function database and or solutions achieved by applying the M-SAC methodology.

EXAMPLES

As discussed herein, the M-SAC fitting method overcomes the limitations of the prior art and represents a significant advancement in curve-fitting technology which holds potential for a variety of different practical applications including the compensation of electronic oscillators for temperature and other environmental effects. The following examples present a comparative analysis of M-SAC curve fitting performance as measured against prior art fitting methods.

All of the following Figures are formatted so that the original data and the fit of that data are scaled on the left hand axis while the residual error is scaled on the right hand axis. Where applicable, graphic representations of segmented curve fits utilize various traces to show segment boundaries. These traces are also notated with the order of polynomial function used to fit that particular segment. The present disclosure contemplates a M-SAC fitting method designed to incorporate a function bank containing both polynomial and non-polynomial functions (i.e. log, sigmoid, and exponential). However, it is observed that limiting the function bank to polynomials may hold potential for a significant processing speed advantage. This is due to the availability of regression-solving techniques as opposed to the inherently slower gradient reduction methods that are needed for non-polynomial functions. The examples contemplate a function bank that utilizes polynomial functions and polynomial regression for the curve fitting of oscillator temperature data. However, these examples are not intended to in any way limit the scope of the present disclosure and it is contemplated that other functions and solving methods may be used as appropriate to accommodate other types of data or a particular data set.

Experimental Techniques

Frequency versus temperature data from an actual 2.0 mm×1.6 mm crystal oscillator was curve-fit using the M-SAC fitting method described herein as well as other fitting methods of the prior art which have been used in the temperature compensation of electronic oscillators. Although temperature compensation was not actually performed during this analysis, the software-simulations of fit performance alone yielded a sufficient number of performance metrics so as to permit an objective and quantitative comparison of all fitting methods. As described herein, these performance metrics include deterministic solutions, precision of fit, storage density, and curve fit process time.

Analysis

Figure 17:
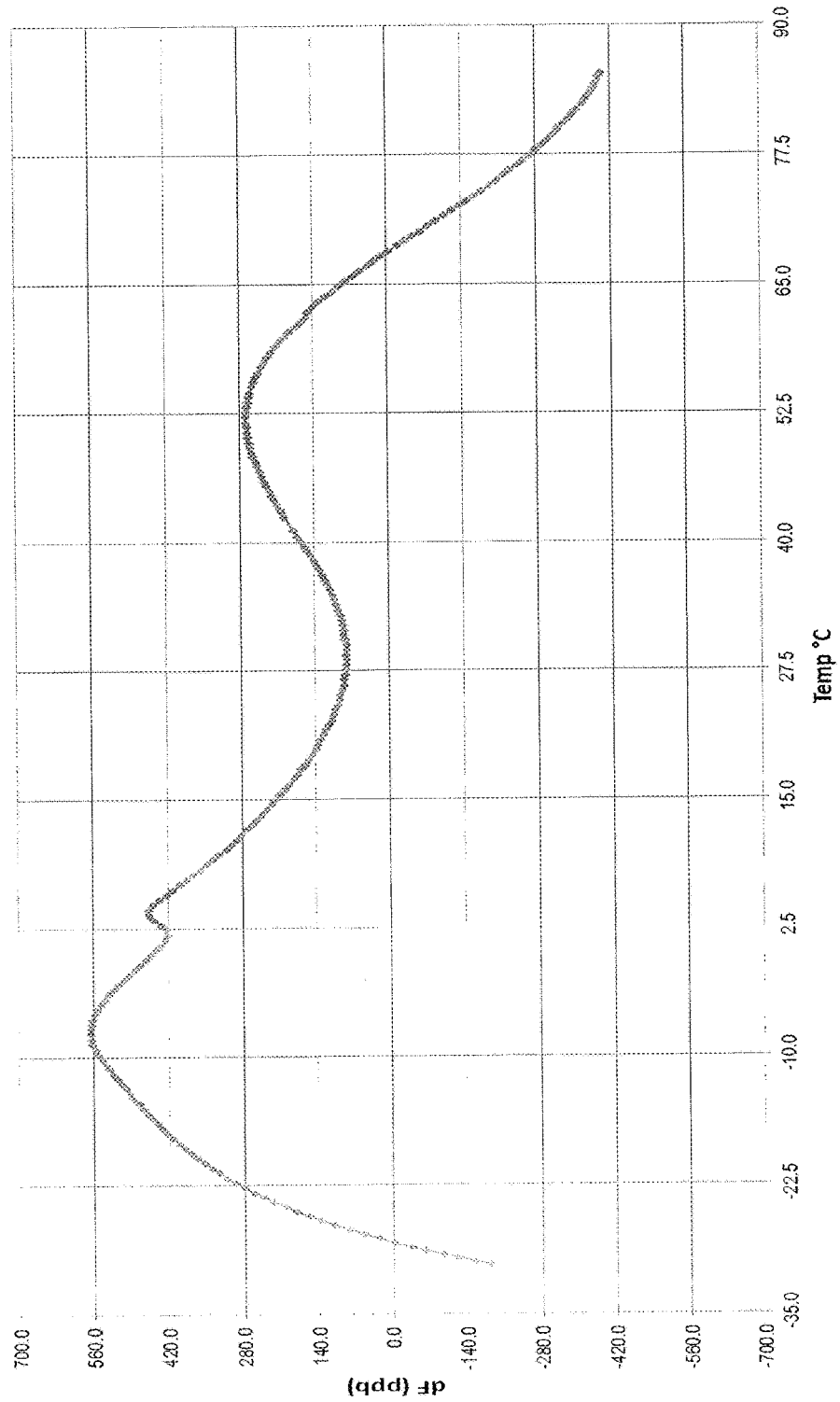
FIG. 17 is representative of typical frequency versus temperature performance that is achievable for a contemporary TCXO incorporating a $5^{th}$ order polynomial voltage generator.

FIG. 17 illustrates typical frequency versus temperature performance that is achievable for a contemporary TCXO incorporating a $5^{th}$ order polynomial voltage generator. The voltage generator depicted is a digitally programmable analog solution that generates the voltage inverse of the frequency versus temperature characteristic which is applied to a variable capacitance diode to correct the frequency for changes in temperature. The data represented in FIG. 17 was measured on an actual 2.0 mm×1.6 mm crystal oscillator, which is a device readily-available at many electronic distributors. This is also the performance attainable using a resistor-thermistor (R-T) network, which is a technology that is used in some space and military applications where tolerance to electromagnetic radiation is needed. The R-T technology uses fixed slope thermistors in combination with series and parallel resistors to generate the voltage inverse of the frequency versus temperature characteristic. The voltage generated from the R-T network is applied to a variable capacitance diode to correct the oscillator frequency for changes in temperature. Recent improvements to the polynomial voltage generators utilized in many contemporary oscillator Application Specific Integrated Circuits ("ASIC's") now hold potential for enabling oscillator temperature stabilities of 200 ppb peak to peak over the Industrial temperature range of −40° C. to +85° C. This is a stability that cannot be matched by the R-T method. Unless there are operational environment limitations, such as high temperature or electromagnetic radiation, even the older polynomial generator ASICs are preferred and have in fact supplanted the R-T network for the temperature compensation of electronic oscillators in most commercial applications. Therefore, since the technology has become very limited in its application, the curve fitting performance of the R-T network was not assessed or compared to the M-SAC method.

Figure 18:
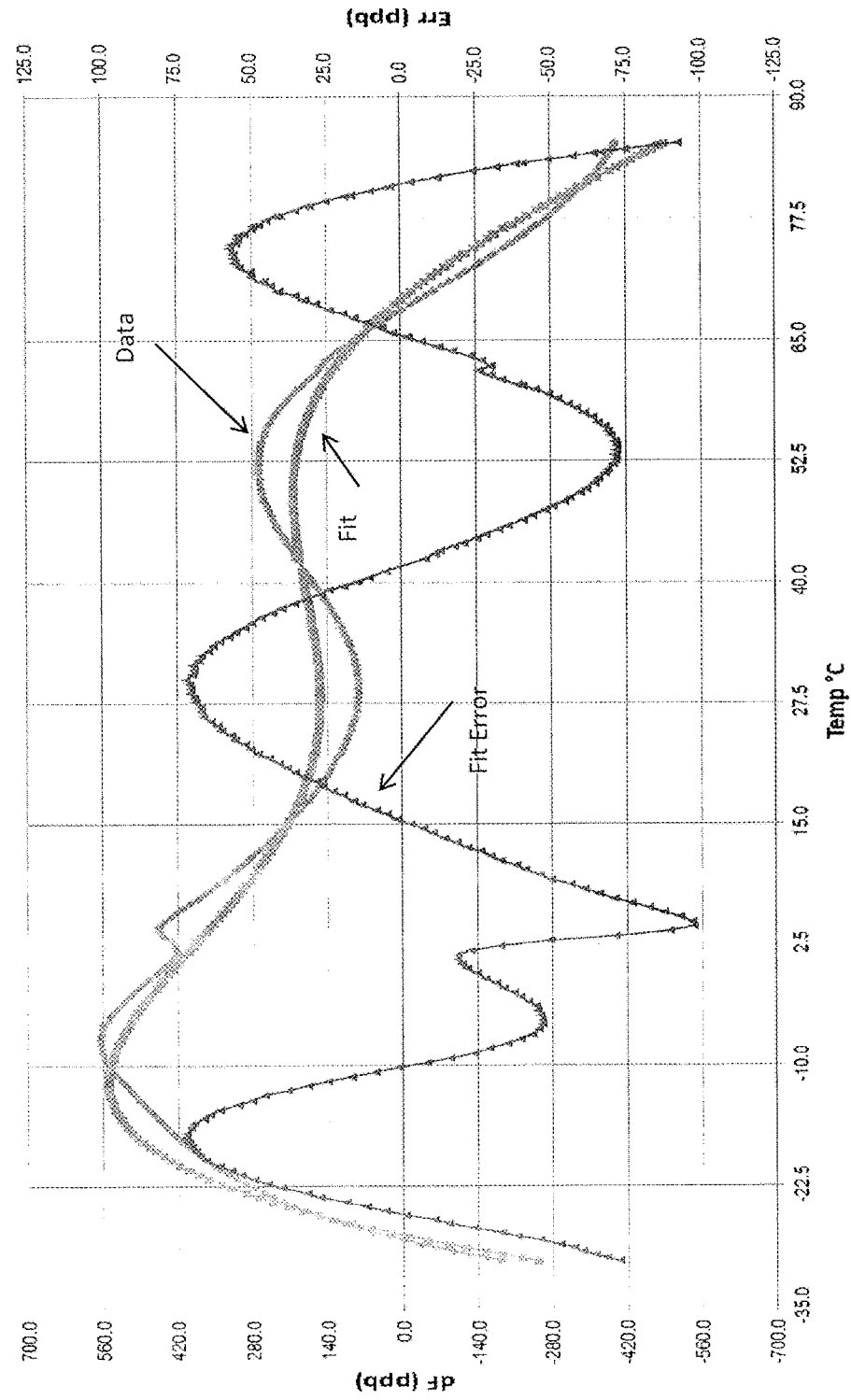
FIG. 18 is representative of the results of applying a $5^{th}$ order polynomial curve fit as a secondary compensation to the temperature performance of the data in FIG. 17.

FIG. 18 illustrates the result of applying another $5^{th}$ order polynomial curve fit as a secondary compensation to the temperature performance illustrated in FIG. 17. This secondary compensation yields a peak to peak curve fit error of about 170 ppb which indicates that the original frequency versus temperature performance should be improved to that level. This is also an example of how the segmentation is controlled by adjusting the error tolerance. This simulation illustrates a single segment curve fit that was accomplished by increasing the error tolerance to a level where a $5^{th}$ order polynomial could fit the entire data set using a single segment. This example also demonstrates the need for an alternative method of compensation where stabilities better than the current state of the art (±100 ppb) are needed.

There are several fitting methods currently in use today which will provide sub 100 ppb performance. However, the ANN and the M-SAC are the only technologies available that are multi-dimensional, that is to say, able to be applied to the compensation of multiple interdependent environmental effects on electronic oscillators. This gives these two technologies an inherent advantage over all other methods. However, the following analysis is limited to the evaluation of curve fit performance with respect to the single-dimensional application as used in the temperature compensation of electronic oscillators. For this purpose, a state of the art target specification of +25 ppb, or 50 ppb peak to peak is used. This target specification provides the means for an objective comparison of the M-SAC method to each of the other methods employed today for the temperature compensation of electronic oscillators. In addition to the target specification, an attempt is made to obtain the best possible solution. This provides an additional metric for comparison across the various fitting methods.

In the following example, linear interpolation is evaluated. This technology is currently employed in MCXO and other digital designs where a lookup table is used to store the linear slope and intercept coefficients as well as temperature locations where these coefficients are used. This technique is normally employed is to characterize the device at evenly spaced temperatures. The slope and intercept coefficients are calculated for pairs of these characterization points so that interpolated points can be calculated at temperatures between the measured temperature points. From a practical perspective, the behavior and stability of the data may require that the number of points may be increased to achieve the desired overall curve fit tolerance.

Figure 19:
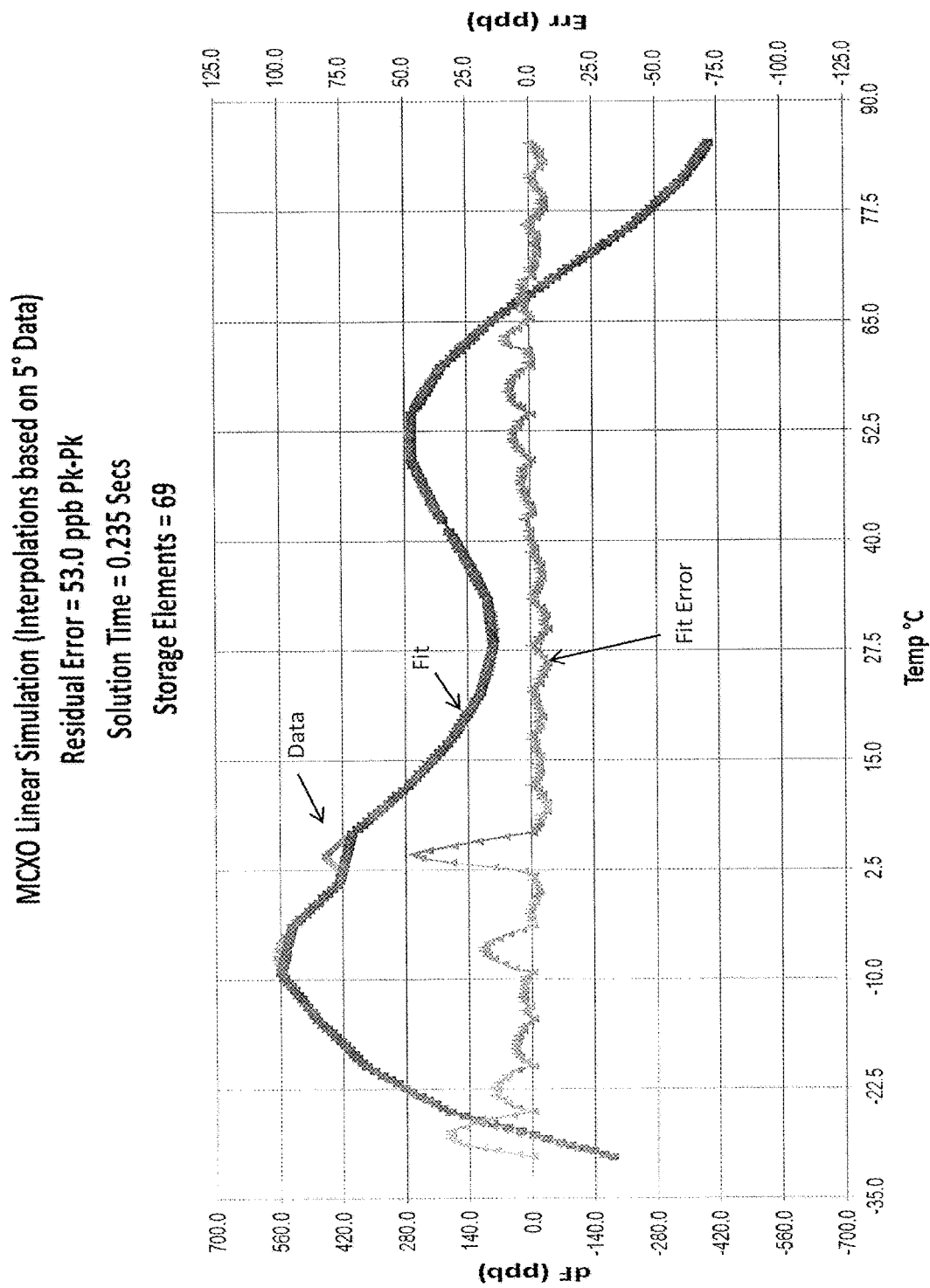
FIG. 19 is representative of the results of applying a 5° C. increment, linear interpolation as a secondary compensation (MCXO) to the temperature performance of the data in FIG. 17 to achieve the target stability specification.

This point is illustrated in the following example where the measured data depicted in FIG. 17 had to be used in 5° increments in order to achieve the target stability specification. FIG. 19 illustrates how this solution performed.

Figure 20:
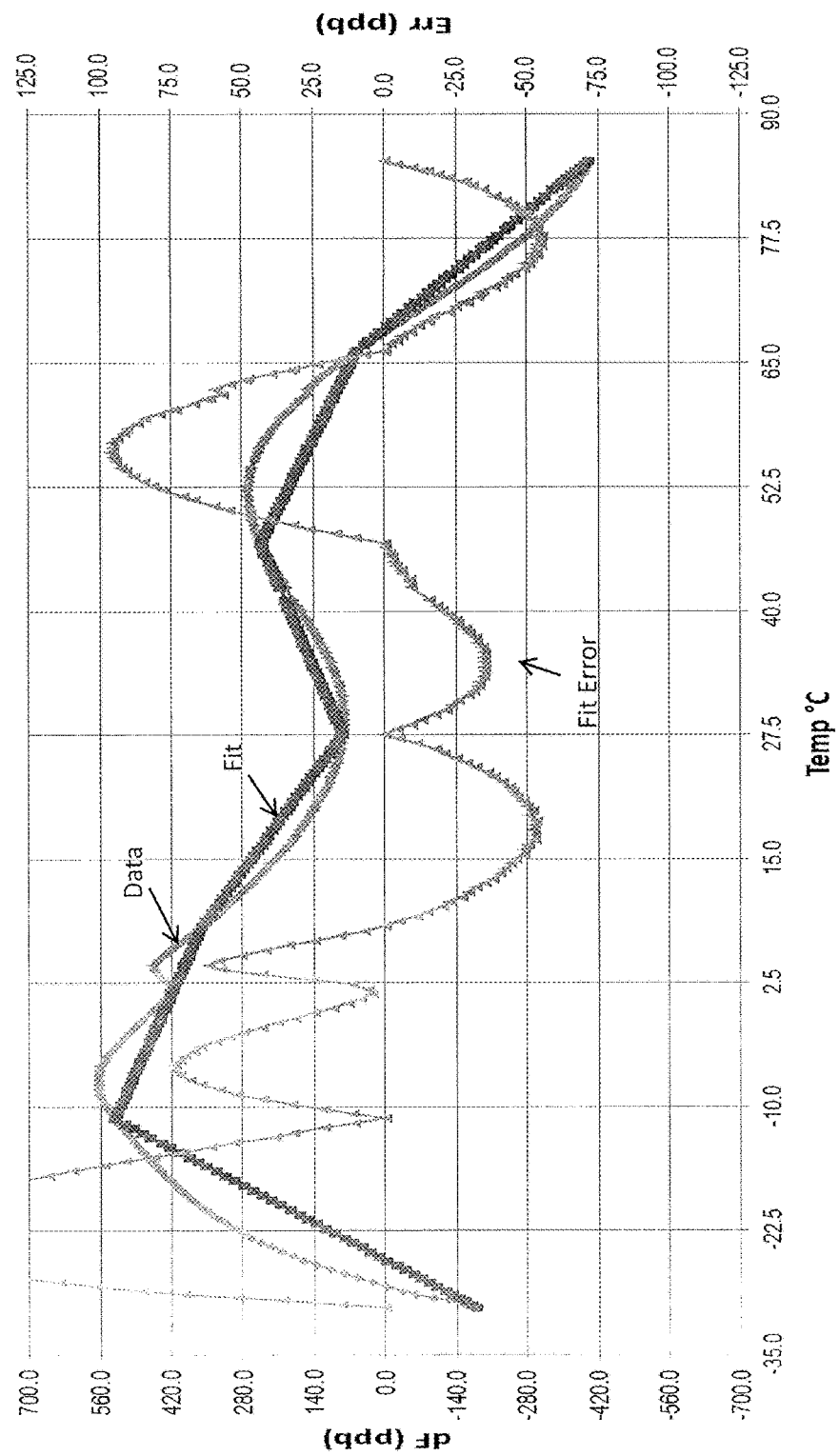
FIG. 20 is representative of the results of applying a 19° C. increment, linear interpolation as a secondary compensation (MCXO) to the temperature performance of the data in FIG. 17.

At 0.235 seconds, the linear interpolation method outperformed all other simulation trials for solution speed. However, the number of storage elements exceeded what was required to solve the target specification using either the ANN or the M-SAC methods. For example, the M-SAC solution of the target specification illustrated in FIG. 25 required only 21 storage elements. In order to evaluate how the linear interpolation method would fare with the same number of storage elements, the temperature increment in the solution illustrated by FIG. 19 was increased in 1° increments until a solution using 21 storage elements was achieved. This resulted in 19° increments which produced the unacceptable error of 237.5 ppb peak to peak as illustrated in FIG. 20. This underscores the fitting superiority of the M-SAC method over the linear interpolation method where very few storage elements are needed for very high precision curve fits. Thus, in applications where minimizing the number of storage elements is a greater concern than solution time, the M-SAC offers a significant advantage.

Figure 21:
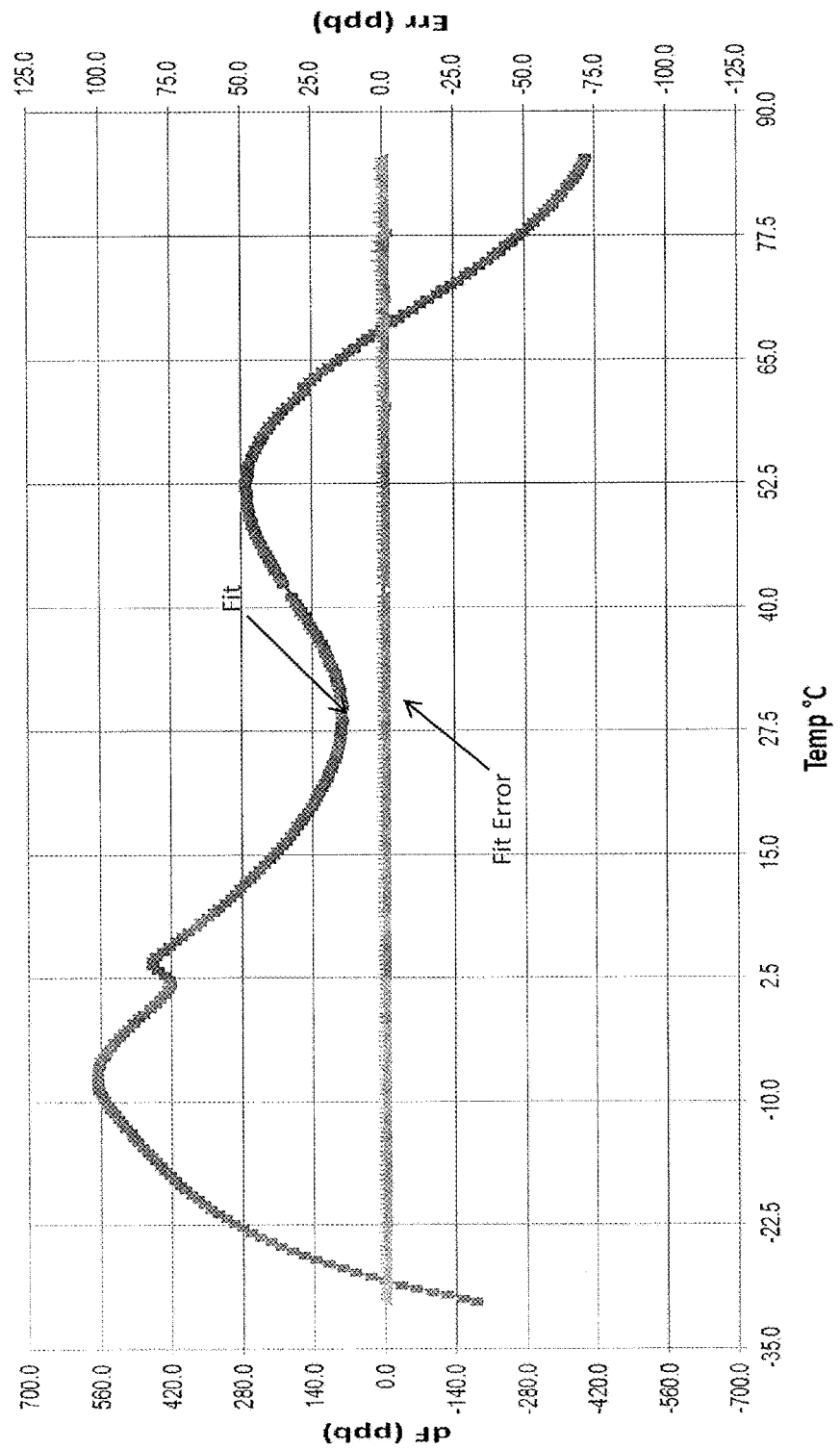
FIG. 21 is representative of the results obtained when attempting to achieve the best performance of the solution using the linear interpolation method.

FIG. 21 illustrates the results of the attempt to achieve the best performance using the linear interpolation method where it can be seen that a curve fit of noise level of the data was achieved with a point to point fit of all data points. Again this fit was achieved very quickly but with the consequence of a very large number of storage elements.

Figure 22:
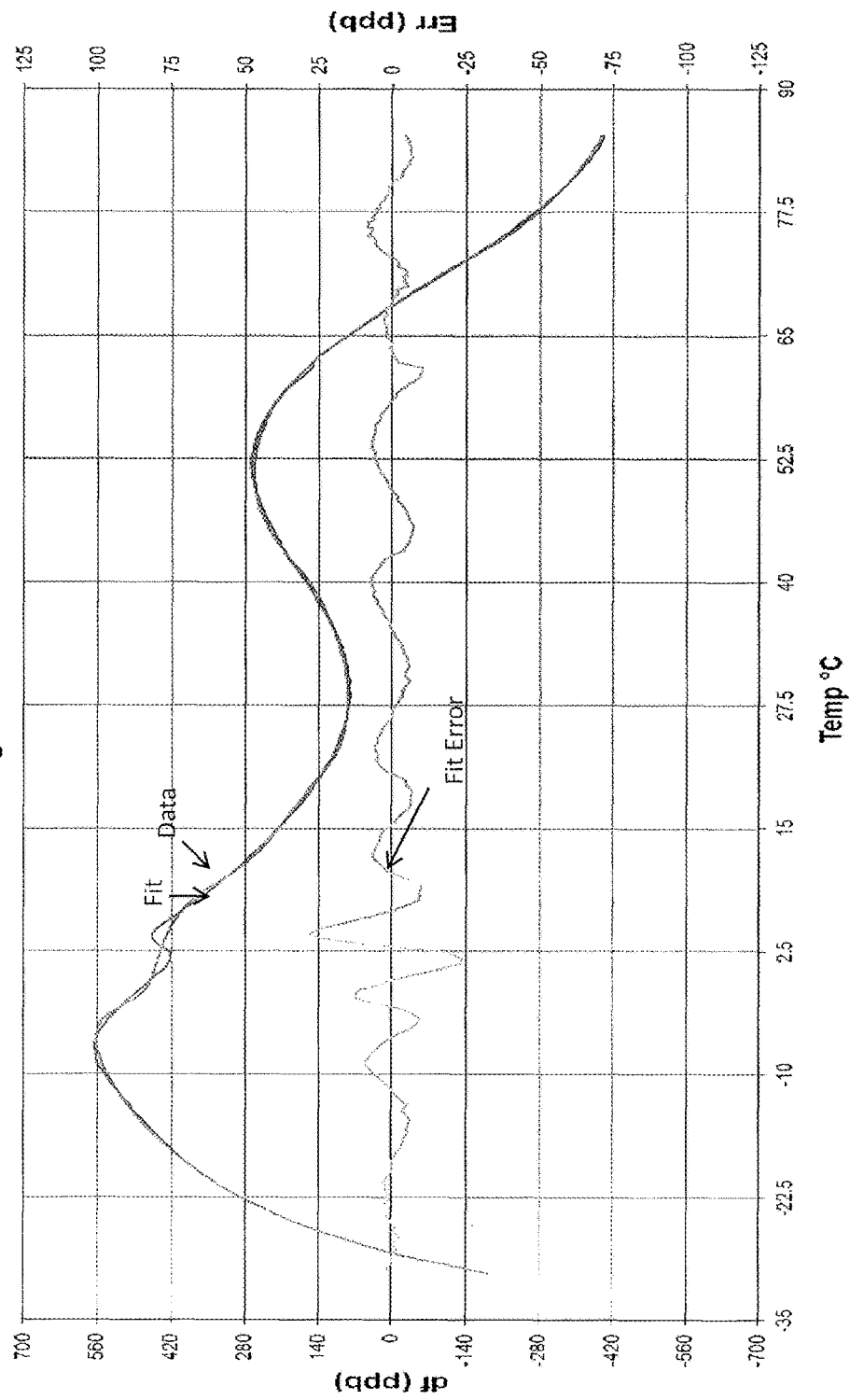
FIG. 22 is representative of a 15 neuron, 46 storage element, ANN curve fit solution of the data originally presented in FIG. 17.

FIG. 22 illustrates the results of an ANN curve fit solution of the data originally presented in FIG. 17. Due to the fact that the ANN does not provide a deterministic solution, the simulation illustrated in FIG. 22 ultimately needed 15 evenly spaced neurons at the cost of 46 storage elements, a number which was derived through experimental trials where the number of neurons was increased until the 50 ppb peak to peak target specification was achieved.

As illustrated in FIG. 22, the solution tolerance was easily achieved. At 46 storage elements, the ANN solution outperformed the linear interpolation method, but provided inferior performance with respect to the 21 storage elements needed for the M-SAC method. The time needed to solve the ANN was also longer than what was needed for both linear interpolation and M-SAC methods. The reasons for the increased solution time are described in more detail throughout the present disclosure and are due to the required gradient reduction solution techniques and indeterminate nature of the solution using "teaching" and "learning" sessions to "train'" the network to achieve the desired performance.

Figure 23:
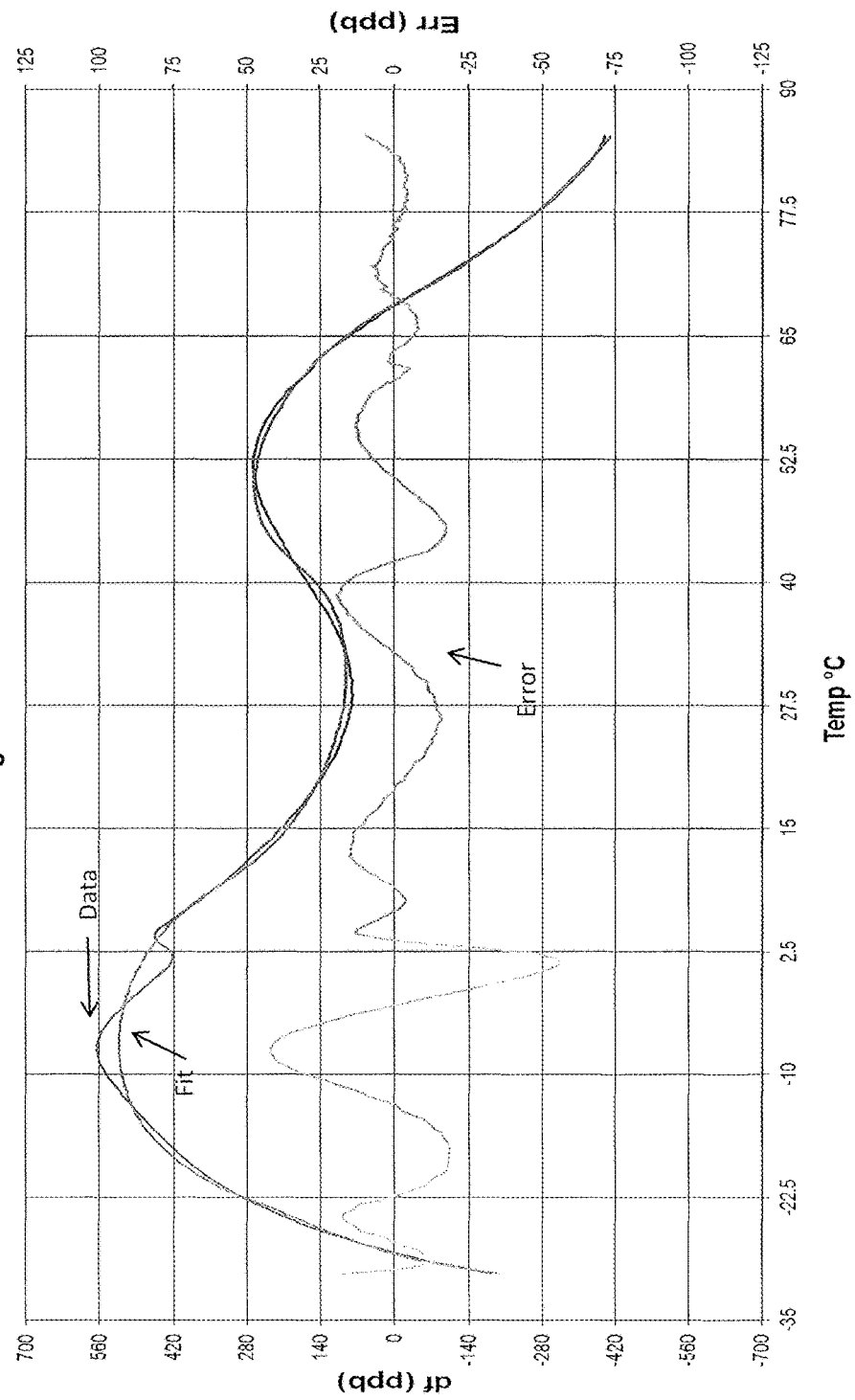
FIG. 23 is representative of a 7 neuron, 22 storage element, ANN curve fit solution of the data originally presented in FIG. 17.

As with the linear interpolation method, the data was re-fit using the ANN method, limited to 22 storage elements (22 is the closest to the number required by the M-SAC method to fit to the target specification of 50 ppb peak to peak). The results of this solution are illustrated in FIG. 23, where it can be seen that 78 seconds was required to obtain a fit with a residual error of 98.8 ppb.

Figure 24:
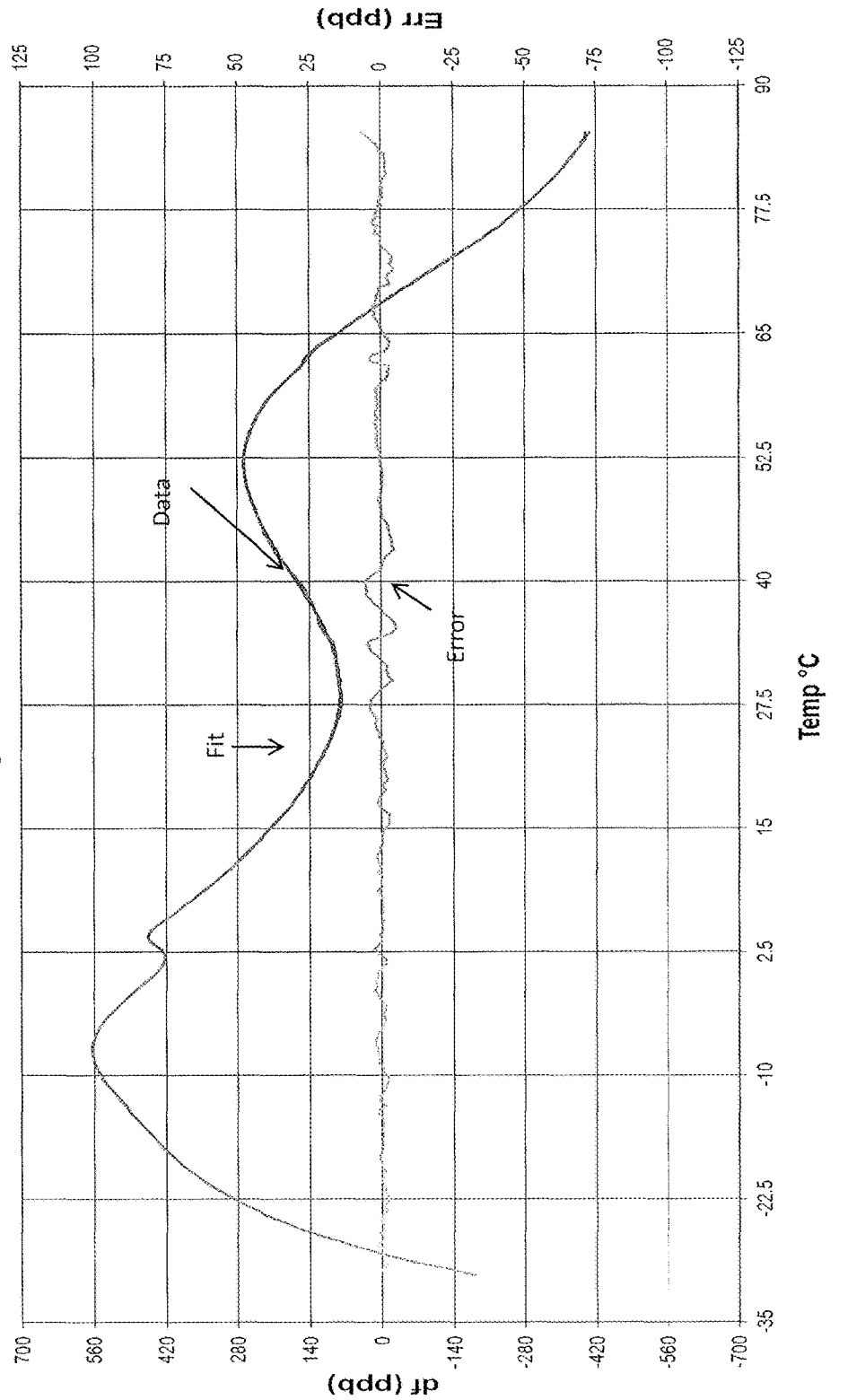
FIG. 24 is representative of a 60 neuron, 181 storage element, ANN curve fit solution of the data originally presented in FIG. 17 where the number of neurons were increased in an attempt to achieve optimal curve performance.

FIG. 24 illustrates the results of a 60 neuron solution where the number of neurons were increased in an attempt to achieve optimal curve fit performance. While the initial goal was to achieve performance similar to that which was realized with the linear interpolation simulation, the evaluation was abandoned on the 60 neuron trial due to the prohibitive solution time encountered (3300 seconds).

Finally, the M-SAC method was evaluated. FIG. 25 illustrates the results of an M-SAC curve fit of the data originally presented in FIG. 17. Table 3, below, illustrates the function utilization and coefficients derived in the processing of the fit of FIG. 25. As disclosed herein, the function bank contains polynomial and non-polynomial functions; all functions are illustrated in Table 3. However, the non-polynomial functions were excluded from this evaluation.

Referring again to FIG. 25, it can be seen that the specified limit of the target specification 50 ppb peak to peak) was exceeded by the actual fit performance. This is simply a consequence of the quality of the initial data set and the number of data points. The fitting methodology guarantees the fit error will not exceed the entered value, but the resolution of the original data and the storage element optimization process will both influence the actual realized results. At 21 storage elements, the M-SAC method pro-

TABLE 3

| Start Temp | Func Code | Function Coefficients | | | | | |
|---|---|---|---|---|---|---|---|
| | | f | e | d | c | b | a |
| −30.211 | 4 | | −5.5585351E02 | 4.1792493E03 | −1.1793783E04 | 1.4806890E04 | −6.9765251E03 |
| 0.898 | 4 | | −4.8216616E02 | 4.1701015E03 | −1.3511581E04 | 1.9436767E04 | −1.0470931E04 |
| 30.461 | 4 | | 1.2512320E02 | −1.2431078E03 | 4.6171919E03 | −7.5993811E03 | 4.6791711E03 |

| Function Bank Utilization Summary | | | | |
|---|---|---|---|---|
| Function Code | Function Equation Detail | Function Usage Count | Elements per Function | Total Storage Elements Rq'd |
| 1 | $b * T + a$ | 0 | 4 | 0 |
| 2 | $c * T^2 + b * T + a$ | 0 | 5 | 0 |
| 3 | $d * T^3 + c * T^2 + b * T + a$ | 0 | 6 | 0 |
| 4 | $e * T^4 + d * T^3 + c * T^2 + b * T + a$ | 3 | 7 | 21 |
| 5 | $f * T^5 + e * T^4 + d * T^3 + c * T^2 + b * T + a$ | 0 | 8 | 0 |
| 6 | $1/(e^{(-a * T + b)})$ | 0 | 4 | 0 |
| 7 | $a + b * Ln(c * T + 1)$ | 0 | 5 | 0 |
| 8 | $a * e^{(T * b)}$ | 0 | 4 | 0 |

Total elements used in current solution = 21

FIG. 26 and Table 4 below illustrate the results of decreasing the fit tolerance in an attempt to achieve optimal curve fit performance using the M-SAC method.

vided the best fit for the fewest number of storage elements of any of the methods simulated. This is true for solving to the target specification as well as to the lowest error possible.

TABLE 4

| Start Temp | Func Code | Function Coefficients | | | | | |
|---|---|---|---|---|---|---|---|
| | | f | e | d | c | b | a |
| −30.211 | 4 | | −9.9261080E02 | 7.3638783E03 | −2.0500581E04 | 2.5385302E04 | −1.1795494E04 |
| −14.547 | 3 | | | −2.6743003E02 | 1.5133346E03 | −2.8525239E03 | 1.7935038E03 |
| −4.414 | 2 | | | | −1.7976820E00 | 4.7108335E00 | 2.3545340E−01 |
| 1.359 | 2 | | | | 1.8312640E02 | −7.3848515E02 | 7.4694881E02 |
| 3.266 | 4 | | 1.0526697E03 | −5.4390594E03 | 6.8692942E03 | 4.1298520E03 | −9.0649977E03 |
| 7.695 | 3 | | | 9.3653061E00 | −5.2848288E01 | 9.5537956E01 | −5.2008751E01 |
| 36.758 | 3 | | | −4.6173729E01 | 3.2511219E02 | −7.6153919E02 | 5.9559829E02 |
| 58.922 | 2 | | | | −7.5386889E00 | 3.5587251E01 | −3.9609532E01 |
| 61.797 | 3 | | | 1.2377041E03 | −9.5063086E03 | 2.4334717E04 | −2.0759462E04 |
| 65.719 | 4 | | −1.5908987E02 | 1.7359602E03 | −7.0895199E03 | 1.2841257E04 | −8.7013645E03 |

| Function Bank Utilization Summary | | | | |
|---|---|---|---|---|
| Function Code | Function Equation Detail | Function Usage Count | Elements per Function | Total Storage Elements Rq'd |
| 1 | $b * T + a$ | 0 | 4 | 0 |
| 2 | $c * T^2 + b * T + a$ | 3 | 5 | 15 |
| 3 | $d * T^3 + c * T^2 + b * T + a$ | 4 | 6 | 24 |
| 4 | $e * T^4 + d * T^3 + c * T^2 + b * T + a$ | 3 | 7 | 21 |
| 5 | $f * T^5 + e * T^4 + d * T^3 + c * T^2 + b * T + a$ | 0 | 8 | 0 |
| 6 | $1/(e^{(-a * T + b)})$ | 0 | 4 | 0 |
| 7 | $a + b * Ln(c * T + 1)$ | 0 | 5 | 0 |
| 8 | $a * e^{(T * b)}$ | 0 | 4 | 0 |

Total elements used in current solution = 60

The solution time was also dramatically improved over that of the ANN method, second only to the linear interpolation method, which provided the fastest solution time, but also the poorest storage density.

At 2.0 ppb peak to peak, the minimum error trial illustrated in FIG. 26 clearly shows that the M-SAC method provided a solution that exceeded the best solution of any of the methods simulated. As disclosed herein, the ANN functions exist over the entire temperature range and as such, interact unpredictably in the "training" and "learning" processes. Because of random seeding, the functions may solve to a poor local minima and interact with other neurons in an undesirable manner thus creating undulations that cannot be removed. This point illustrates the difficulty of implementing this curve fitting method in high-precision applications.

Conclusion

The examples set forth herein illustrate the superior performance of the M-SAC fitting method as compared to the state of the art temperature compensation applications for electronic oscillators (sub ±50 ppb). The M-SAC outperforms all other methods of curve fitting for precision of fit and the number of solution storage elements required for implementation. It also provides the fastest solution time, beating all other methods except linear interpolation. However, with respect to linear interpolation, the M-SAC method is a true curve-fit of the data and thus tracks the non-linear regions between characterization temperatures. Additionally, M-SAC is the only method, other than the ANN that can support multi-dimensional fitting. Therefore, the M-SAC achieves a better overall score of technological superiority, making it worthy of classification as the new benchmark for curve fitting methods for use in the temperature compensation of electronic oscillators.

While the disclosure has been described in detail in reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

We claim:

1. A system comprising:
    at least one multi-function segmented array compensation module comprising at least one processor configured to receive at least one output signal from an electronic oscillator wherein each output signal corresponds to an environmental parameter and wherein each multi-function segmented array compensation module is further configured to assess each output signal and generate at least one correction voltage to thereby compensate the oscillator for the associated environmental parameter;
    at least one sensor operably coupled to the oscillator to thereby assess at least one of the environmental parameters experienced by the oscillator; and
    a user EFC operably coupled to the oscillator, wherein the multi-function segmented array compensation module, the sensor, and the user EFC are configured so as to operate as a closed loop system.

2. The system of claim 1 further comprising two or more input signals, wherein each input signal corresponds to one or more different environmental parameters.

3. The system of claim 1 wherein the sensor is further located within the electronic oscillator.

4. The system of claim 1 wherein the sensor is further located outside of the electronic oscillator.

5. The system of claim 1 wherein there is no physical connection between the user EFC and the electronic oscillator.

6. The system of claim 1 wherein the user EFC and the electronic oscillator are physically connected.

7. The system of claim 1 wherein the environmental parameter further comprises at least one of pressure, aging, air flow, off-time, on-time, thermal history, temperature, acceleration sensitivity, vibration, and orientation effects.

8. A system comprising:
    a plurality of multi-function segmented array compensation modules wherein:
        each multi-function segmented array compensation module is configured to compensate an electronic oscillator for a particular environmental parameter which is different from the environmental parameter each other multi-function segmented array compensation module is configured to compensate for, and further comprises at least one processor configured to receive at least one output signal from the electronic oscillator wherein each output signal corresponds to an environmental parameter wherein each multi-function segmented array compensation module is further configured to assess each output signal and generate at least one correction voltage to thereby compensate the oscillator for the associated environmental parameter;
    a plurality of sensors operably coupled to the oscillator wherein each sensor is configured to assess a particular environmental parameter experienced by the oscillator which is different from the environmental parameter each other sensor is configured to assess; and
    a user EFC operably coupled to the oscillator, wherein the multi-function segmented array compensation modules, the sensors, and the user EFC are configured so as to operate as a closed loop system.

9. The system of claim 8 further comprising two or more input signals, wherein each input signal corresponds to one or more different environmental parameters.

10. The system of claim 8 wherein at least one sensor is further located within the electronic oscillator.

11. The system of claim 8 wherein at least one sensor is further located outside of the electronic oscillator.

12. The system of claim 8 wherein there is no physical connection between the user EFC and the electronic oscillator.

13. The system of claim 8 wherein the user EFC and the electronic oscillator are physically connected.

14. The system of claim 8 wherein the environmental parameter further comprises two or more of pressure, aging, air flow, off-time, on-time, thermal history, temperature, acceleration sensitivity, vibration, and orientation effects.

* * * * *